United States Patent
Jeong et al.

(10) Patent No.: US 10,992,273 B2
(45) Date of Patent: Apr. 27, 2021

(54) ELECTRONIC DEVICE AND OPERATION METHOD THEREOF

(71) Applicant: SAMSUNG ELECTRONICS CO., LTD., Suwon-si (KR)

(72) Inventors: Hyeonsik Jeong, Suwon-si (KR); Jaeyoun Cho, Suwon-si (KR); Sangmo Son, Suwon-si (KR); Shukjae Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/558,955

(22) Filed: Sep. 3, 2019

(65) Prior Publication Data

US 2020/0076389 A1 Mar. 5, 2020

(30) Foreign Application Priority Data

Sep. 3, 2018 (KR) .................. 10-2018-0104698

(51) Int. Cl.
*H03G 3/24* (2006.01)
*H04N 21/439* (2011.01)
*G10L 15/20* (2006.01)
*G10L 21/0364* (2013.01)

(52) U.S. Cl.
CPC ............. *H03G 3/24* (2013.01); *G10L 15/20* (2013.01); *G10L 21/0364* (2013.01); *H04N 21/4398* (2013.01)

(58) Field of Classification Search
CPC . G10L 15/20; G10L 21/0364; G10L 21/0272; H03G 3/24; H04N 21/4398; H04R 3/04

USPC .......................................................... 381/57
See application file for complete search history.

(56) References Cited

U.S. PATENT DOCUMENTS

| 6,480,821 B2 | 11/2002 | Macho et al. |
| 6,993,480 B1 | 1/2006 | Klayman |
| 7,747,028 B2 * | 6/2010 | Saito .................. G10L 21/0208 381/107 |
| 8,744,091 B2 | 6/2014 | Chen et al. |

(Continued)

FOREIGN PATENT DOCUMENTS

| KR | 10-0607010 B1 | 8/2006 |
| KR | 10-1662946 B1 | 10/2016 |
| KR | 10-1682796 B1 | 12/2016 |

OTHER PUBLICATIONS

International Search Report (PCT/ISA/210) and Written Opinion (PCT/ISA/237) dated Dec. 16, 2019, issued by the International Searching Authority in International Application PCT/KR2019/011337.

*Primary Examiner* — Jason R Kurr
(74) *Attorney, Agent, or Firm* — Sughrue Mion, PLLC

(57) ABSTRACT

Provided are an electronic device and an operation method thereof. The operation method of an electronic device for processing an audio signal may include obtaining viewing environment information related to sound intelligibility, processing an input audio signal by separating the input audio signal into a first channel including a primary signal and a second channel including an ambient signal based on the viewing environment information, processing the input audio signal based on a frequency band and based on the viewing environment information, and generating an output signal based on processing the input audio signal.

13 Claims, 20 Drawing Sheets

(56) References Cited

U.S. PATENT DOCUMENTS

| | | | |
|---|---|---|---|
| 9,866,955 B2 | 1/2018 | Kleijn et al. | |
| 2004/0125962 A1* | 7/2004 | Christoph | H03G 5/005 |
| | | | 381/59 |
| 2009/0304191 A1* | 12/2009 | Hoang Co Thuy | |
| | | | G10L 21/0208 |
| | | | 381/57 |
| 2010/0202631 A1 | 8/2010 | Short | |
| 2011/0125491 A1 | 5/2011 | Alves et al. | |
| 2011/0255699 A1* | 10/2011 | Osada | H03G 3/32 |
| | | | 381/57 |
| 2012/0121096 A1 | 5/2012 | Chen et al. | |
| 2015/0325250 A1 | 11/2015 | Woods et al. | |
| 2017/0257715 A1 | 9/2017 | Lee et al. | |
| 2019/0362735 A1* | 11/2019 | Muench | G10L 19/008 |

* cited by examiner

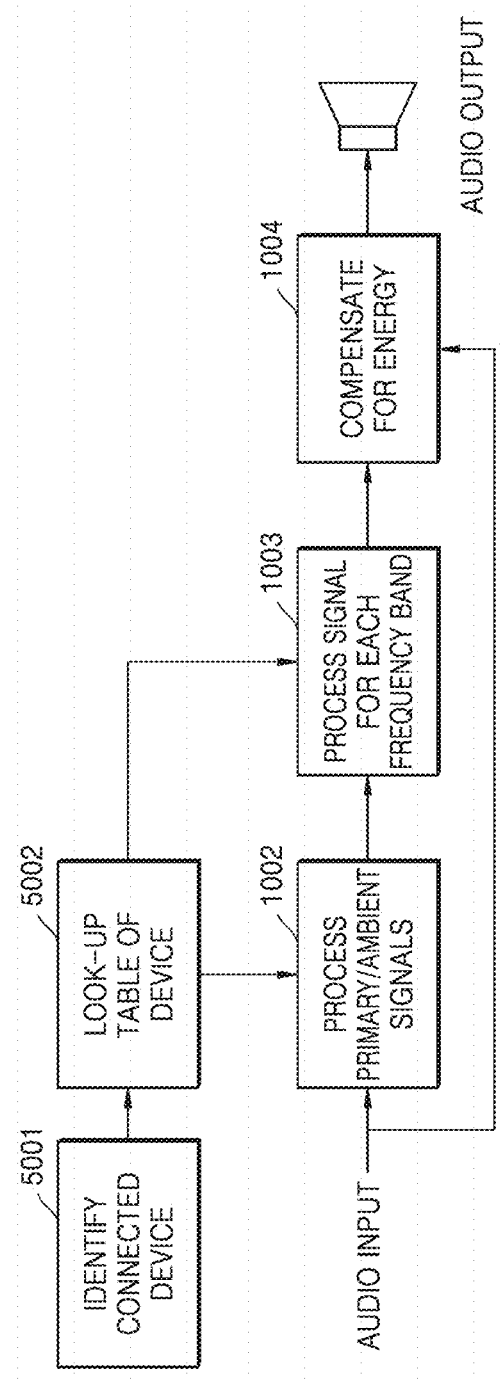

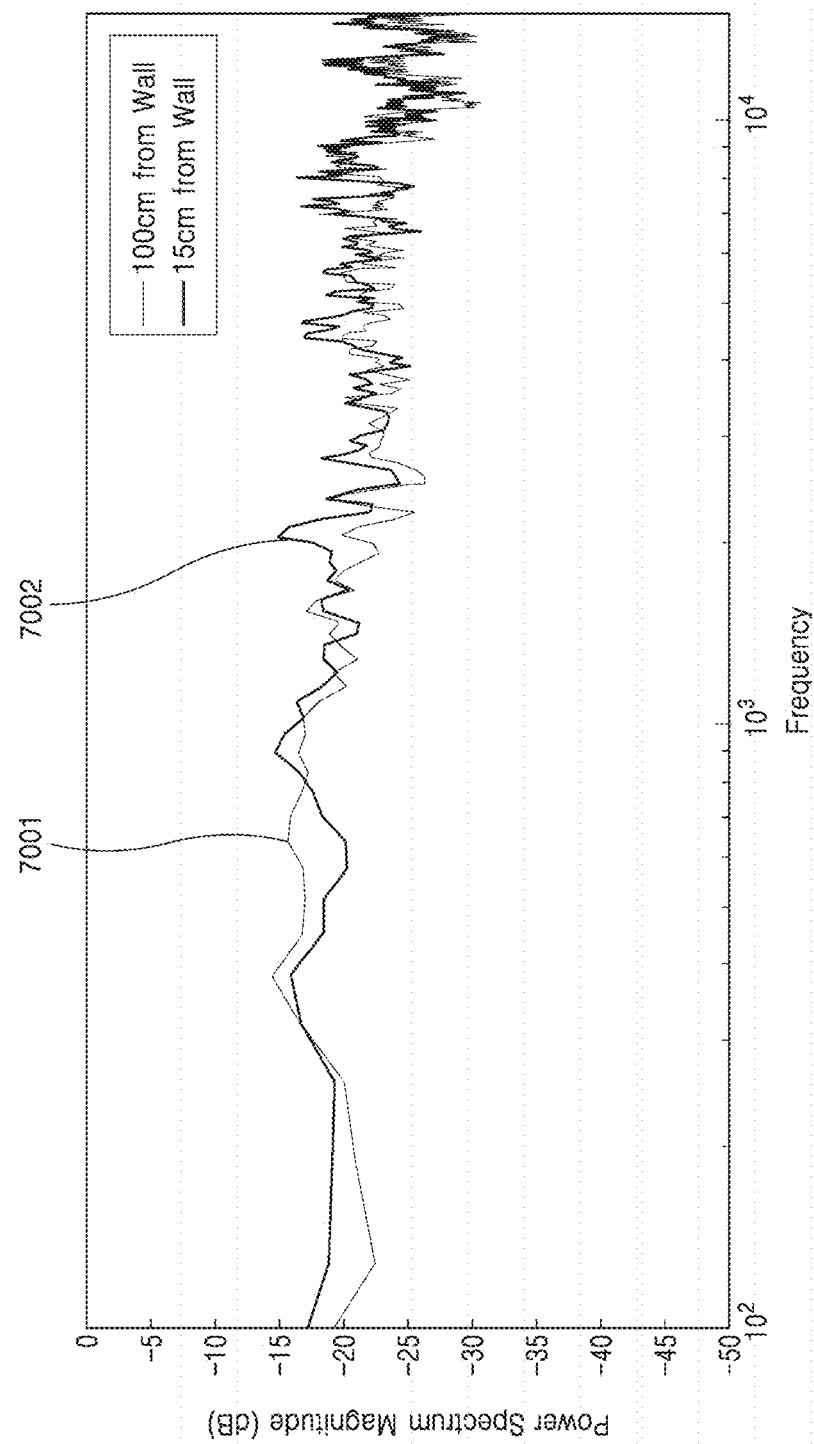

FIG. 11
PRIMARY (WEIGHT HIGH) (1101)
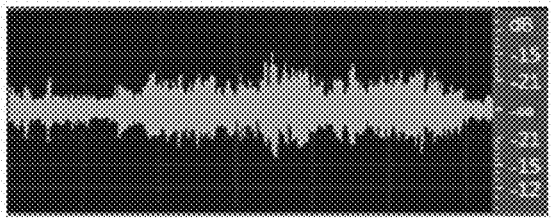
PRIMARY (WEIGHT LOW) (1102)
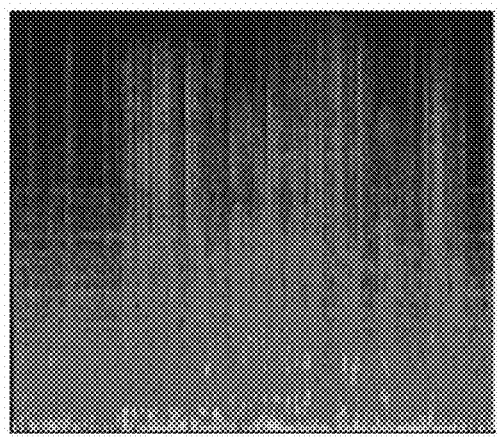
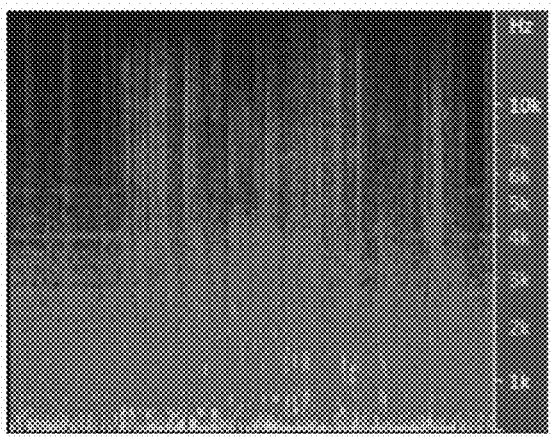

FIG. 19

| | INPUT SIGNAL | | OUTPUT SIGNAL | |
|---|---|---|---|---|
| | Left | Right | Left | Right |
| Peak Amplitude: | -12.10 dB | -12.09 dB | -8.71 dB | -8.81 dB |
| True Peak Amplitude: | -12.09 dBTP | -12.09 dBTP | -8.68 dBTP | -8.77 dBTP |
| Maximum Sample Value: | 8135 | 7720 | 12020 | 11885 |
| Minimum Sample Value: | -7361 | -8149 | -9517 | -9545 |
| Possibly Clipped Sample: | 0 | 0 | 0 | 0 |
| Total RMS Amplitude: | -24.21 dB | -23.80 dB | -24.76 dB | -24.70 dB |
| Maximum RMS Amplitude: | -19.09 dB | -19.03 dB | -18.07 dB | -18.08 dB |
| Minimum RMS Amplitude: | -56.89 dB | -56.95 dB | -74.61 dB | -74.63 dB |
| Average RMS Amplitude: | -25.21 dB | -24.97 dB | -26.17 dB | -26.13 dB |
| DC Offset: | 0.00 % | 0.00 % | 0.02 % | 0.02 % |
| Measured Bit Depth: | 16 | 16 | 32 | 32 |
| Dynamic Range: | 37.81 dB | 34.92 dB | 56.54 dB | 56.56 dB |
| Dynamic Range Used: | 14.45 dB | 14.80 dB | 15.90 dB | 15.75 dB |
| Loudness: | -23.00 dB | -21.96 dB | -23.85 dB | -24.13 dB |
| Perceived Loudness: | -22.91 dB | -21.75 dB | -21.08 dB | -21.16 dB |

ELECTRONIC DEVICE AND OPERATION METHOD THEREOF

CROSS-REFERENCE TO RELATED APPLICATION(S)

This application is based on and claims priority under 35 U.S.C. § 119 to Korean Patent Application No. 10-2018-0104698, filed on Sep. 3, 2018, in the Korean Intellectual Property Office, the disclosure of which is incorporated by reference herein in its entirety.

BACKGROUND

1. Field

The disclosure relates to an electronic device and an operation method thereof, and more particularly, to an electronic device that processes an audio signal based on viewing environment information and an operation method thereof.

2. Description of Related Art

Display apparatuses display images viewable by users. The users may view broadcast content through the display apparatuses. Such display apparatuses display, on their displays, broadcast content selected by the users from among broadcast signals transmitted from broadcasting stations. Broadcast content has been recently changed from analog broadcast into digital broadcast all over the world.

Digital broadcast includes transmission of digital images and audio signals. Compared with analog broadcast, digital broadcast is more robust and less susceptible to external noise, and thus has advantages such as reduced data loss, improved error correction, improved resolution, and improved screen quality. In addition, unlike analog broadcast, digital broadcast may provide bi-directional services.

When a user views broadcast content or a variety of content using a speaker, a sound bar, or the like, of a display device, sound intelligibility is also important in addition to image quality.

Recently, there is a demand for a method of providing an improved sound intelligibility to a user in various viewing environments.

SUMMARY

Provided are an electronic device that processes an audio signal based on viewing environment information and an operation method thereof.

Additional aspects will be set forth in part in the description which follows and, in part, will be apparent from the description, or may be learned by practice of the presented embodiments of the disclosure.

According to an embodiment, an operation method of an electronic device for processing an audio signal includes obtaining viewing environment information related to sound intelligibility, processing an input audio signal by separating the input audio signal into a first channel including a primary signal and a second channel including an ambient signal based on the viewing environment information, processing the input audio signal based on a frequency band and based on the viewing environment information, and generating an output signal based on processing the input audio signal.

According to another embodiment, an electronic device for processing an audio signal includes a sensor configured to obtain viewing environment information related to sound intelligibility, and one or more processors configured to process an input audio signal by separating the input audio signal into a first channel including a primary signal and a second channel including an ambient signal based on the viewing environment information, process the input audio signal based on a frequency band and based on the viewing environment information, and generate an output signal based on processing the input audio signal.

According to another embodiment, a non-transitory computer-readable recording medium having recorded thereon a program for executing an operation method of an electronic device for processing an audio signal is provided.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5 is a diagram of an electronic device for obtaining information about an ambient device according to an embodiment;

FIG. 6B is a diagram for explaining an example of information associated with an installation environment of an electronic device according to an embodiment;

FIG. 11 is a diagram for explaining an example of processing an audio signal based on separation of a channel including a primary signal and a channel including an ambient signal from an input audio signal according to an embodiment;

FIG. 19 is a diagram for explaining an example of energy compensation of a processed audio signal according to an embodiment.

DETAILED DESCRIPTION

Figure 1:
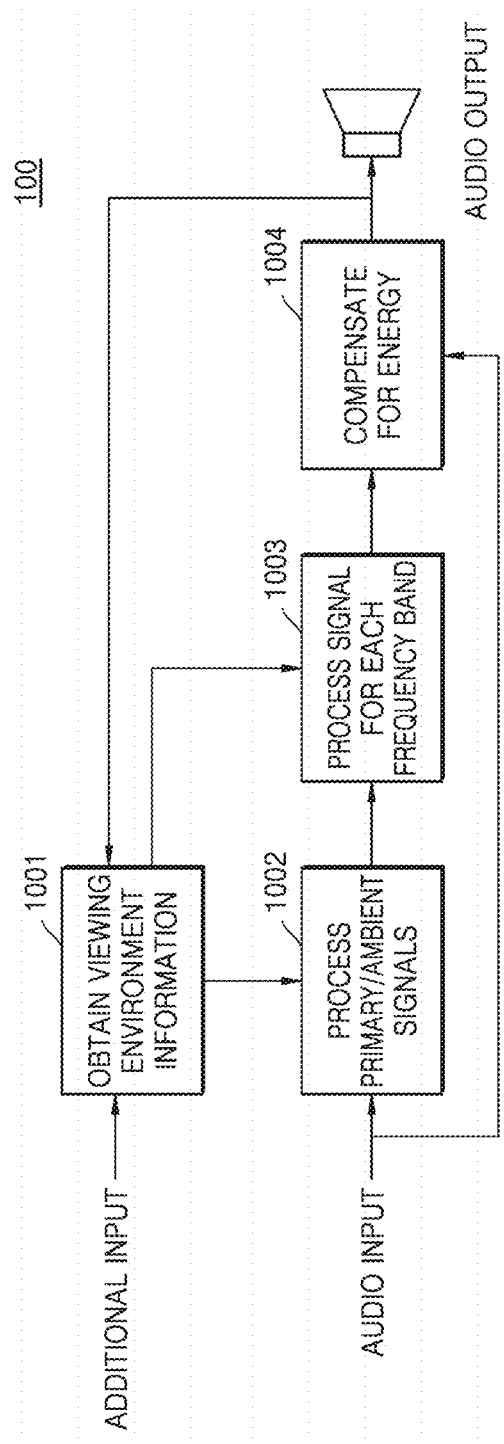
FIG. 1 is a diagram of an electronic device according to an embodiment.

The disclosure will now be described more fully with reference to the accompanying drawings, in which embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. For clarity, portions that are not relevant to the description of the disclosure are omitted, and like reference numerals in the drawings denote like elements.

The terms used in this specification are those general terms currently widely used in the art in consideration of functions regarding the disclosure, but the terms may vary according to the intention of those of ordinary skill in the art, precedent, or new technology in the art. Also, specified terms may be selected by the applicant, and in this case, the detailed meaning thereof will be described in the detailed description of the disclosure. Thus, the terms used in the specification should be understood based on the meaning of the terms and the overall description of the disclosure.

While such terms as "first," "second," etc., may be used to describe various components, the above terms are used to distinguish one component from another.

The terms used in the present specification are merely used to describe particular embodiments of the disclosure, and are not intended to limit the disclosure. An expression used in the singular form encompasses the expression in the plural form, unless it has a clearly different meaning in the context. It will be understood that when region is referred to as being "connected to" another region, the region may be directly connected to the other region or electrically connected thereto with an intervening region therebetween. It will be further understood that the terms "comprises" and/or "comprising" used herein specify the presence of stated features or components, but do not preclude the presence or addition of one or more other features or components.

The use of the terms "a," "and," "the," and similar references in the context of describing the disclosure are to be construed to cover both the singular form and the plural form. Also, when a specific process order is not clearly stated, described processes may be performed in an appropriate order. Processes described in the disclosure are not limited to the described order.

Phrases such as "in an embodiment" and "in another embodiment" in the present specification might not indicate the same embodiment.

The disclosure may be described in terms of functional block components and various processing steps. Some or all functional blocks may be realized as any number of hardware and/or software components configured to perform the specified functions. For example, the functional blocks may be realized by at least one micro-processor or circuit for performing certain functions. Also, the functional blocks may be realized with any programming or scripting language. The functional blocks may be realized in the various algorithms that are executed by one or more processors. Furthermore, the disclosure could employ any number of conventional techniques for electronics configuration, signal processing and/or control, data processing, and the like. The words "mechanism," "element," "means," and "configuration" are used broadly and are not limited to mechanical or physical embodiments of the disclosure.

Furthermore, the connecting lines or connectors shown in the various figures presented are intended to represent exemplary functional relationships and/or physical or logical couplings between the various elements. It should be noted that many alternative or additional functional relationships, physical connections, or logical connections may be present in a device in practice.

Throughout the disclosure, the expression "at least one of a, b, or c" indicates only a, only b, only c, both a and b, both a and c, both b and c, all of a, b, and c, or variations thereof.

Hereinafter, the disclosure will be described in detail with reference to the attached drawings.

FIG. 1 is a diagram of an electronic device 100 according to an embodiment.

The electronic device 100 according to an embodiment (hereinafter, the electronic device 100) may be a device that outputs sound. The electronic device 100 may process an audio input signal to generate an audio output signal.

According to an embodiment, the electronic device 100 may process the audio input signal based on a viewing environment around the electronic device 100, so as to more clearly transfer sound to a user.

For example, in the related art, when a listener views multimedia content using a speaker of a television (TV), a sound bar, an artificial intelligence (AI) speaker, or the like, sound intelligibility of the multimedia content may be lowered according to sound of surrounding people, operating sound of surrounding devices, a size of a room, an installation environment of the TV, etc.

According to an embodiment, in various viewing environments, the electronic device 100 may provide an improved sound intelligibility.

For example, when volume is increased for the purpose of improving intelligibility, then the overall energy of an audio signal may increase excessively and the listener may feel that the volume is too loud. However, according to an embodiment, the energy may be reduced in a relatively unnecessary part of the audio signal (e.g., an ambient signal part, a low frequency part, and a high frequency part) in order to improve the sound intelligibility, and the energy may be focused in a relatively more important part (e.g., a primary signal part and a speech band part) in order to improve the sound intelligibility. Thereby, the sound intelligibility may be improved in a state in which the overall energy of the audio signal is similar or the volume does not excessively increase, and the listener may hear a more comfortable sound in any viewing environment.

The electronic device 100 according to an embodiment may include a sensor 1001 that is configured to obtain viewing environment information, a primary/ambient signal processor 1002, a frequency band signal processor 1003, and an energy compensator 1004.

The sensor 1001 that is configured to obtain viewing environment information according to an embodiment may obtain the viewing environment information using at least one sensor embedded in the electronic device 100, a microphone configured to receive a sound input, a transceiver configured to receive information via a communication interface, etc.

The viewing environment information according to an embodiment may include at least one of information associated with ambient noise of the electronic device 100, information associated with a space where the electronic device 100 is located, information associated with an ambient device of the electronic device 100, information associated with an installation environment of the electronic device 100, or the like.

The sensor 1001 that is configured to obtain the viewing environment information according to an embodiment may transmit the obtained viewing environment information to the primary/ambient signal processor 1002 and/or the frequency band signal processor 1003.

The primary/ambient signal processor 1002 according to an embodiment may process and separate the audio signal into a first channel including a primary signal that predominantly contributes to the sound intelligibility of the audio signal, and a second channel including an ambient signal having less influence to the sound intelligibility as compared to the primary signal.

For example, the primary signal associated with sound intelligibility may be a speech signal. Also, the primary signal may be sound of any object associated with an image when the content is viewed.

Also, for example, the ambient signal may be a background sound other than the speech signal.

The primary/ambient signal processor 1002 according to an embodiment may adjust weights of the primary signal and the ambient signal of the input audio signal based on the viewing environment information received from the sensor 1001 that is configured to obtain the viewing environment information.

The frequency band signal processor 1003 according to an embodiment may separately process a frequency band (e.g., a mid-range frequency band) that predominantly contributes to the sound intelligibility in frequency characteristics, and a frequency band (e.g., low and high range frequency bands) having relatively less influence on the sound intelligibility.

According to human auditory characteristics, a person perceives sound independently for each frequency band. Among the frequency bands, humans are most sensitive to a band of 1 kHz to 5 kHz, which affects clarity of the sound intelligibility. However, this band is also a region that is easily masked by a low note. Masking refers to a phenomenon in which other notes are not audible when any note is present. A listening space with a large reflection characteristic and a large area has a serious influence on the clarity of speech located in the mid-range frequency band due to a diffuse reflection of sound, a long reverberation time, etc.

The frequency band signal processor 1003 according to an embodiment may reduce energy of a frequency band signal having a high noise masking of the low range frequency band, the high range frequency band, and a speech band, and may increase energy of a frequency band signal having a relatively low noise masking of the low speech band, thereby improving the sound intelligibility while maintaining the overall energy.

Moreover, when the primary/ambient signal processor 1002 and the frequency band signal processor 1003 perform audio signal processing to improve the sound intelligibility, the overall energy of a resultant signal processed from the input signal may vary. When the processed signal is compared with the input signal, the energy may be too large or small. The energy compensator 1004 may compensate for a variation of the energy, thereby improving intelligibility of the output signal and simultaneously reducing a difference in the sound volume between the output signal and the input signal and providing a comfortable sound to the user.

According to an embodiment, the structure of the sensor 1001 that is configured to obtain the viewing environment information, the primary/ambient signal processor 1002, the frequency band signal processor 1003, and the energy compensator 1004 shown in FIG. 1 is an embodiment aid and is not limited thereto. For example, an operation of the energy compensator 1004 may be performed by the primary/ambient signal processor 1002 and the frequency band signal processor 1003.

The electronic device 100 according to an embodiment may process the audio signal in consideration of both of an influence of the primary signal and the ambient signal of the audio signal on the sound intelligibility, and an influence of a noise characteristic for each frequency band on the sound intelligibility so as to improve the sound intelligibility. The electronic device 100 may receive various additional inputs such as characteristic information of the electronic device 100, ambient noise information, surrounding viewing environment information (e.g., information identifying the presence (or absence) of walls, a size of a room, a location where the electronic device 100 is installed, etc.). Further, the electronic device 100 may reflect an analysis result of the additional inputs to audio signal processing, thereby providing an improved sound to the listener in any viewing environment when the listener views the content using the electronic device 100. Accordingly, the listener may not be required to perform frequent manipulation of a volume key, etc., and thus convenience of a viewing environment may be improved.

Meanwhile, the electronic device 100 according to an embodiment may be, but is not limited to, a TV. For example, the electronic device 100 may be implemented as various electronic devices such as a desktop, a tablet personal computer (PC), a laptop computer, a mobile phone, an electronic book terminal, a digital broadcast terminal, a personal digital assistant (PDA), a portable multimedia player (PMP), a navigation device, a digital camera, a camcorder, an MP3 player, a wearable device, and the like. Also, the electronic device 100 may be a fixed type or mobile type, and may be a digital broadcast receiver capable of receiving digital broadcast content.

The electronic device 100 according to an embodiment may output content (e.g., image and sound data) that is input via various external input sources (e.g., a set-top box, a tuner, a receiver, etc.)

Also, the electronic device 100 according to an embodiment may be implemented as a curved display device having a curvature, a flexible display device capable of adjusting the curvature, as well as a flat display device. The output resolution of the electronic device 100 may include, for example, high definition (HD), Full HD, Ultra HD, or a resolution that is clearer than Ultra HD.

FIG. 1 illustrates an embodiment and the disclosure is not limited thereto.

Figure 2:
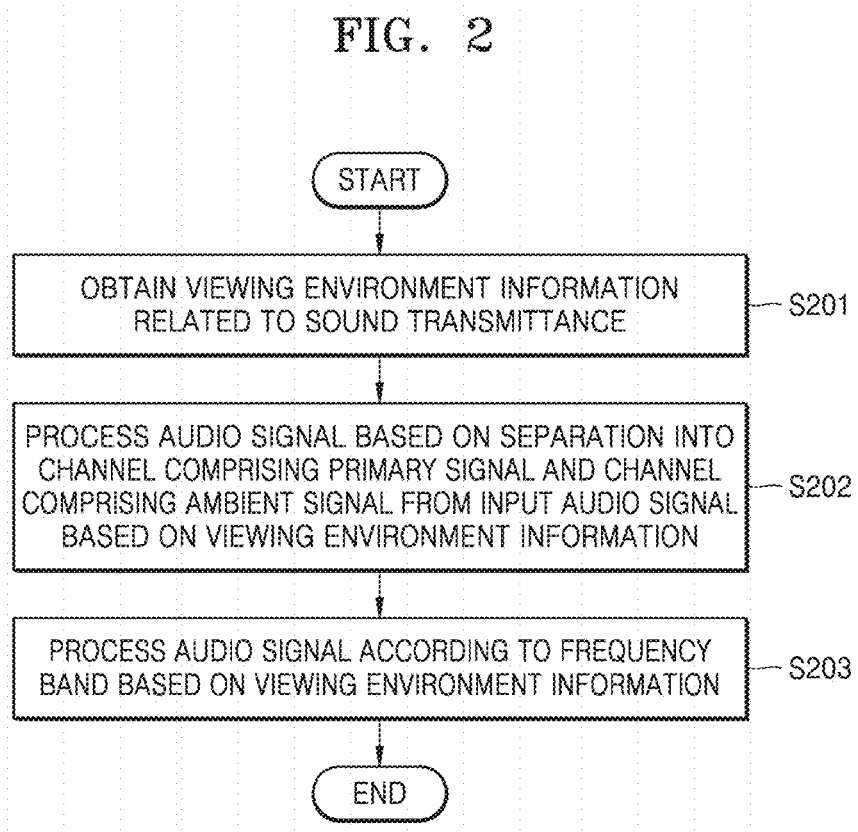
FIG. 2 is a flowchart of an operation method of an electronic device according to an embodiment.

FIG. 2 is a flowchart of an operation method of the electronic device 100 according to an embodiment.

In operation S201 of FIG. 2, the electronic device 100 may obtain viewing environment information related to sound intelligibility.

The electronic device 100 according to an embodiment may obtain the viewing environment information that may influence the intelligibility of an audio signal.

The viewing environment information according to an embodiment may include at least one of information associated with an ambient noise of the electronic device 100, information associated with a space where the electronic device 100 is located, information associated with an ambient device of the electronic device 100, information associated with an installation environment of the electronic device 100, or the like.

For example, the information associated with the ambient device may be information associated with an on/off state of the ambient device, an operation mode, a distance between the ambient device and the electronic device 100, and the like. Also, for example, the information associated with the space where the electronic device 100 is located may be a volume of a room where the electronic device 100 is located, a height of the room, a configuration of the room, and the like.

According to an embodiment, the electronic device 100 may estimate a location (e.g., whether the electronic device 100 is attached to a wall, whether the electronic device 100 is in an open space, etc.) of the electronic device 100 based on a microphone input.

The electronic device 100 according to an embodiment may obtain the viewing environment information, and determine an influence of the viewing environment information on the sound intelligibility based on the viewing environment information. The electronic device 100 may variably determine the degree of weights of a primary signal and an ambient signal that are applied, filtering for each frequency band, and which filter value is applied based on the viewing environment information.

An example of obtaining the viewing environment information according to an embodiment will be described in more detail with reference to FIGS. 3 through 7.

According to an embodiment, the electronic device 100 may process an input audio signal to generate an output signal based on the viewing environment information.

In operation S202 of FIG. 2, the electronic device 100 may process the audio signal by separating the input audio into a first channel including the primary signal, and a second channel including the ambient signal based on the viewing environment information.

According to an embodiment, the electronic device 100 may perform a process of separating the input audio signal into the first channel including the primary signal that is relatively more important to the sound intelligibility, and the second channel including the relatively less important ambient signal, and may apply an appropriate gain to each channel to mix and output an audio signal.

For example, the electronic device 100 may separate an input signal of a two-channel stereo sound source into a plurality of signals. For example, the two-channel stereo input signal may be separated into three signals (e.g., ambient left, center (primary), and ambient right) or separated by further subdividing left/right ambience components. The separated primary signal primary (center) may be mixed with the appropriate gain applied based on the viewing environment information.

An example of processing the audio signal based on extraction of the primary signal and the ambient signal from the input audio signal according to an embodiment will be described in more detail with reference to FIGS. 8 through 12.

In operation S203 of FIG. 2, the electronic device 100 may process the audio signal based on a frequency band based on the viewing environment information.

According to an embodiment, the electronic device 100 may determine a frequency band that is relatively more important to the sound intelligibility based on the viewing environment information.

According to an embodiment, the electronic device 100 may reduce energy of a frequency band that is relatively less important for the sound intelligibility, and increase energy of the frequency band that is relatively more important to the sound intelligibility by a value corresponding to the reduced energy, thereby reducing an energy difference between the input signal and the output signal and improving the sound intelligibility.

According to an embodiment, the electronic device 100 may apply sub-band filtering to the signal received from the primary/ambient signal processor 1002 as shown in FIG. 1 based on the frequency band according to the viewing environment information.

An example of processing the audio signal based on the frequency band according to an embodiment will be described in more detail in the description of FIGS. 13 to 16, which will be described later.

FIGS. 3 through 7 illustrate examples of obtaining viewing environment information according to an embodiment.

Figure 3:
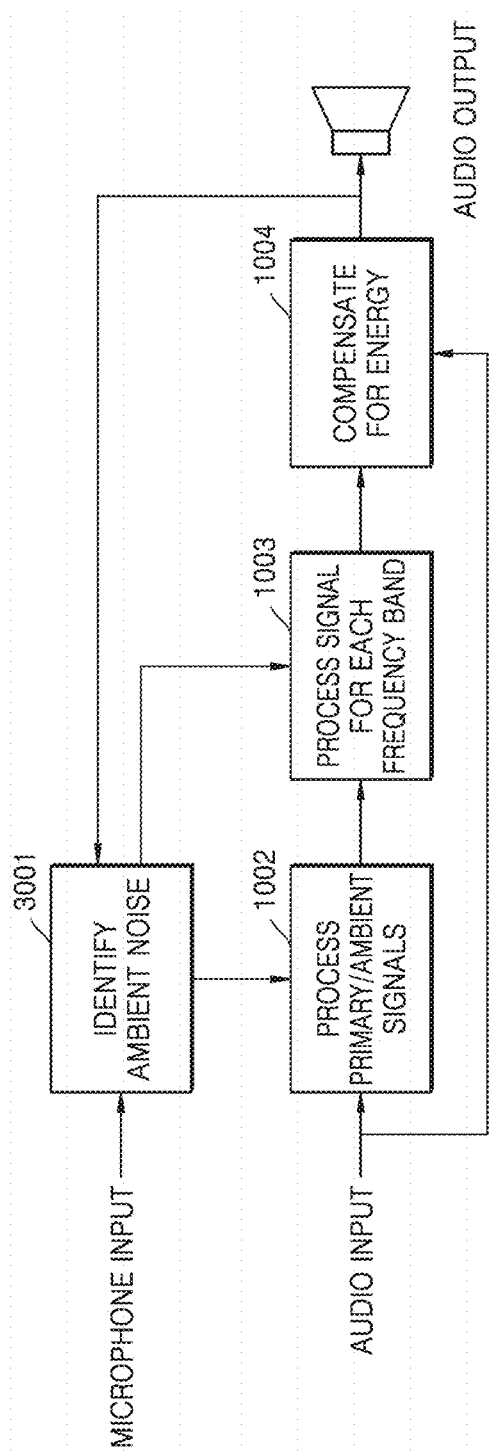
FIG. 3 is a diagram of an electronic device for obtaining information associated with an ambient noise according to an embodiment.

FIG. 3 is a diagram of an electronic device for obtaining information associated with an ambient noise according to an embodiment.

According to an embodiment, the electronic device 100 may measure an ambient noise of the electronic device 100 through a microphone input. According to an embodiment, a microphone may be a microphone of the electronic device 100, may be a microphone of another terminal (e.g., a smart phone, a remote controller, an AI speaker, etc.), or the like.

The electronic device 100 may identify characteristics and a level of the ambient noise input via the microphone (3001).

For example, the ambient noise may be noise generated by ambient devices located in an area surrounding the electronic device 100.

Because magnitude and characteristics of noise are different in various operating modes of ambient devices (e.g., a cleaning device, a mixing device, a hand dryer, etc.) operating in an area around the electronic device 100 audio processing may be different according to the characteristics of the ambient noise in order to improve the sound intelligibility.

Also, for example, the ambient noise may be a general living noise that occurs in a typical home or office.

According to an embodiment, the electronic device 100 may analyze the characteristics and the level of noise input via the microphone in real time.

Also, the electronic device 100 may analyze whether masking occurs by noise, noise characteristics of the frequency band relatively more important to the clarity of sound, and the like.

According to an embodiment, the electronic device 100 may extract the Primary/Ambient signals, and perform signal processing for each frequency band based on the identified characteristics and level of the ambient noise.

Moreover, when the electronic device 100 measures noise via the microphone, ambient noise and an audio output sound that is output from the electronic device 100 may be input together.

Accordingly, the electronic device 100 according to an embodiment may estimate the characteristics and the level of the ambient noise after removing the audio output sound from the sound input via the microphone.

Figure 4:
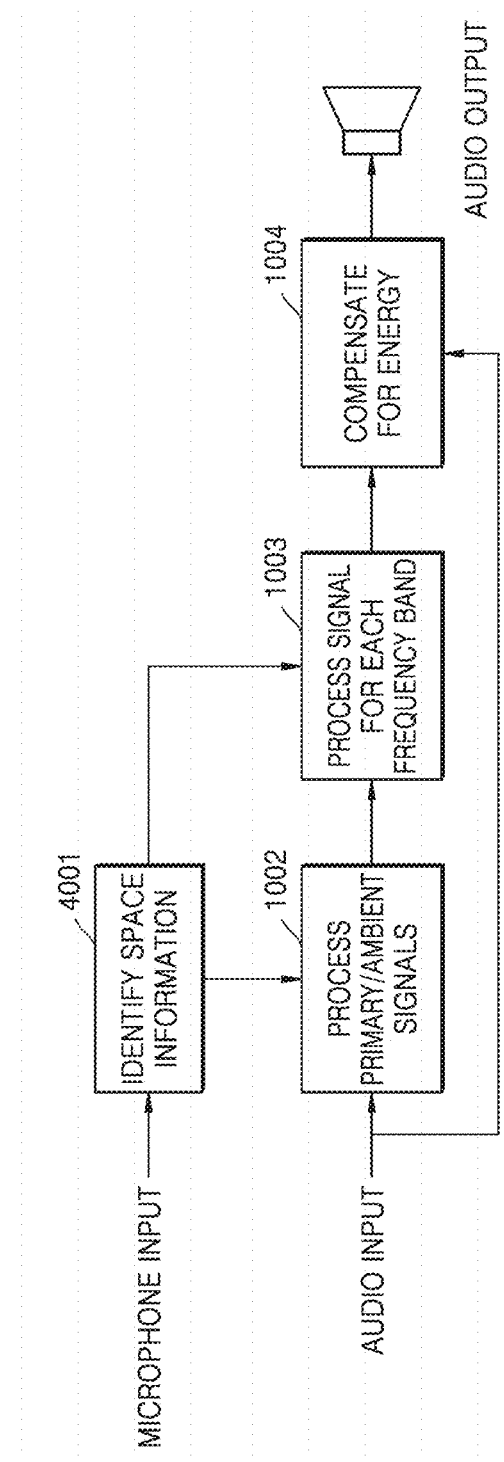
FIG. 4 is a diagram of an electronic device for obtaining information about a space according to an embodiment.

FIG. 4 is a diagram of an electronic device for obtaining information about a space according to an embodiment.

According to an embodiment, the electronic device 100 may identify information associated with the space where the electronic device 100 is located (4001).

For example, the electronic device 100 may measure a reverberation time.

The reverberation time may be determined by volume of a sound space and a sound absorption rate. When the reverberation time is long, speech clarity may be lowered by the reverberation time, and when the reverberation time is short, the sound may be dry and the speech clarity may be lowered.

The electronic device 100 may perform an operation of emphasizing a speech of the primary signal when the measured reverberation time is equal to or longer than a predetermined time (e.g., 380 milliseconds (msec)), and provide reverberation to the ambient signal to increase richness of sound when the measured reverberation time is equal to or shorter than the predetermined time (e.g., 380 msec).

According to an embodiment, the electronic device 100 may extract the Primary/Ambient signals and perform signal processing for each frequency band based on identification of space information.

FIG. 5 is a diagram of an electronic device for obtaining information about an ambient device according to an embodiment.

According to an embodiment, the electronic device 100 may identify a device that is connected to the electronic device 100 (5001). Also, the electronic device 100 may identify a previously stored look-up table of the electronic device 100 (5002).

According to an embodiment, when the electronic device 100 is in communication with another device, the electronic device 100 may use information of the other connected device, thereby improving sound intelligibility of the electronic device 100.

For example, when an air cleaner, a cleaner, or the like, operates around the electronic device 100, noise may be generated. When the electronic device 100 recognizes that another device (e.g., the air cleaner or the cleaner) is located within a communication range, the electronic device 100 may use the previously stored look-up table to process an audio signal based on characteristics and a level of sound generated by the other device. For example, the look-up table may include characteristics and a level of noise generated for each operating mode of the other device (e.g., the air cleaner or the cleaner).

Figure 6A:
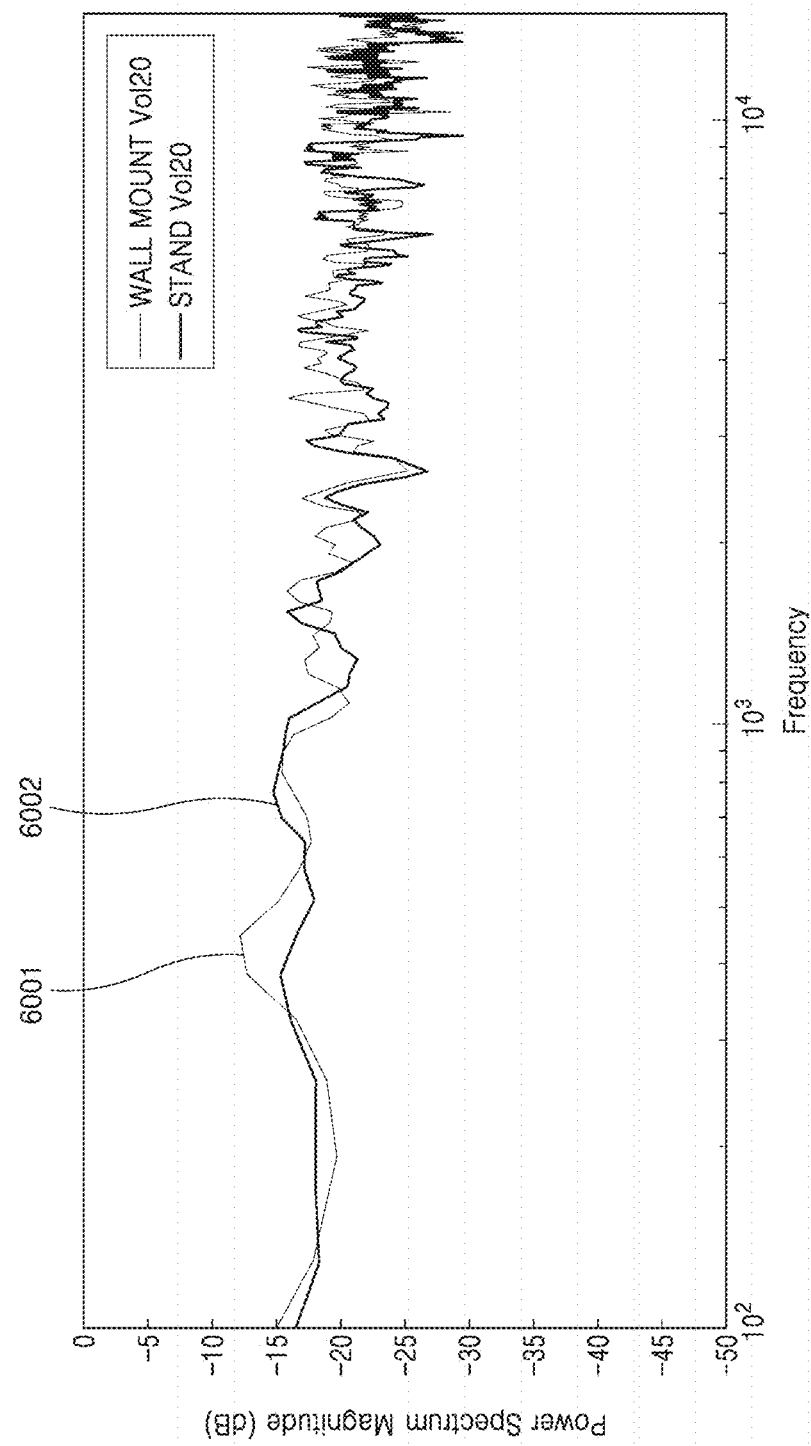
FIG. 6A is a diagram for explaining an example of information associated with an installation environment of an electronic device according to an embodiment.

FIG. 6A is a diagram for explaining an example of information associated with an installation environment of the electronic device 100 according to an embodiment. FIG. 6B is a diagram for explaining an example of information associated with an installation environment of the electronic device 100 according to an embodiment.

FIG. 6A illustrates a frequency characteristic 6001 when the electronic device 100 (for example, a TV) is installed in a wall mount form and reproduces a white noise signal, and a frequency characteristic 6002 when the electronic device 100 (for example, a TV) is installed in a stand form and reproduces the white noise signal. FIG. 6A and FIG. 6B exhibit different frequency waveforms according to the installation environment of the electronic device 100.

For example, when the electronic device 100 is installed in the stand form, a low range frequency band (300 hertz (Hz) or less) is emphasized more than in the wall mount form, and when the electronic device 100 is installed in the wall mount form, a mid-range frequency band (300 Hz to 1 kHz) is emphasized more than in the stand form.

FIG. 6B shows a frequency characteristic of a white noise signal reproduced by the electronic device 100 according to a distance between the electronic device 100 and a rear wall (in case where the distance is 100 cm (7001) and in case where the distance is 15 cm (7002)) when the electronic device 100 (for example, a TV) is installed in the stand form.

For example, when the electronic device 100 is installed close to the rear wall, it may be identified that the low frequency (300 Hz or less) is emphasized.

Referring to FIGS. 6A and 6B, it may be seen that, according to the installation environment of the electronic device 100, frequency characteristics vary when sound is output even in case of the same audio signal.

According to an embodiment, the electronic device 100 may extract Primary/Ambient signals and perform signal processing for each frequency band based on the information associated with the installation environment of the electronic device 100.

Figure 7:
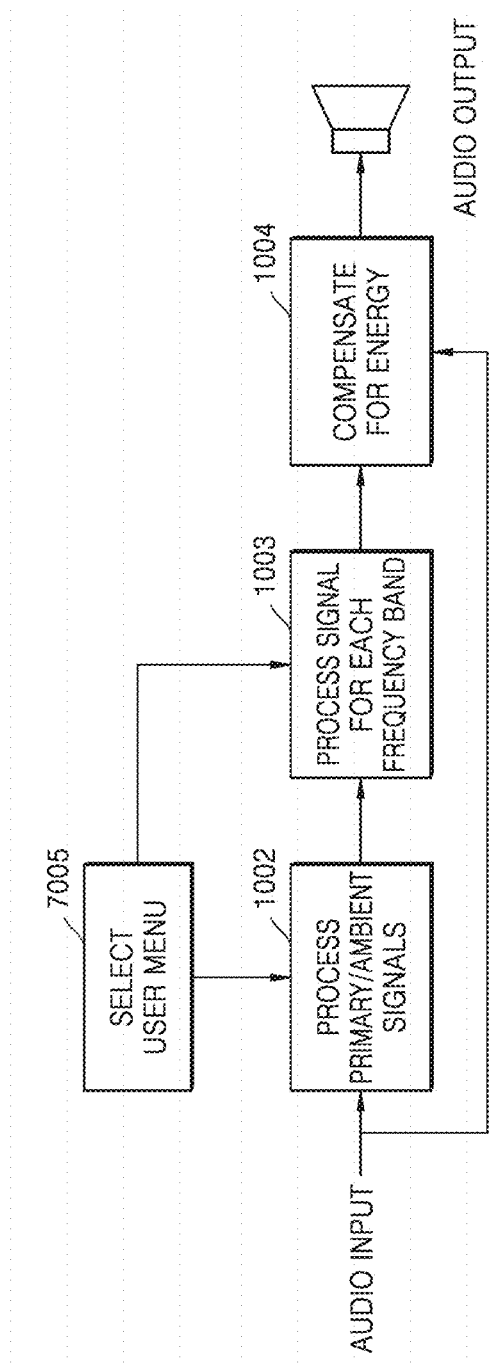
FIG. 7 is a diagram of an electronic device for obtaining viewing environment information based on a user input according to an embodiment.

FIG. 7 is a diagram of an electronic device for obtaining viewing environment information based on a user input according to an embodiment.

According to an embodiment, the electronic device 100 may obtain the viewing environment information based on the user input via a user interface, for example, a menu selection 7005.

For example, the electronic device 100 may receive an input that identifies whether a size of a viewing space, locations of ambient devices, a location of an audio device that is being currently reproduced, and the like, via the user interface.

According to an embodiment, the electronic device 100 may improve sound intelligibility by processing an audio signal based on the viewing environment information obtained based on the user input.

According to an embodiment, even when the electronic device 100 does not sense an ambient viewing environment, the electronic device 100 may obtain the viewing environment information via the user input, thereby improving the intelligibility of the audio signal.

Figure 8:
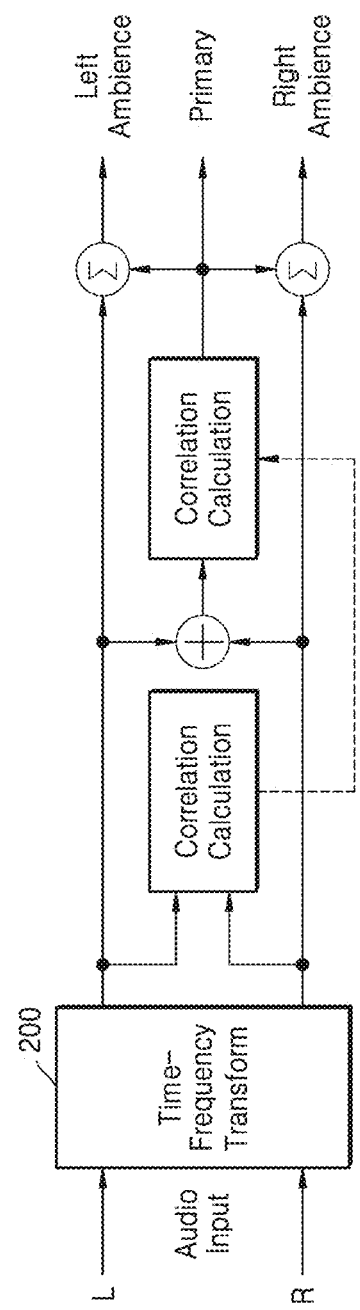
FIG. 8 is a diagram for explaining an example of processing an audio signal based on separation of a channel including a primary signal and a channel including an ambient signal from an input audio signal according to an embodiment.
Figure 9:
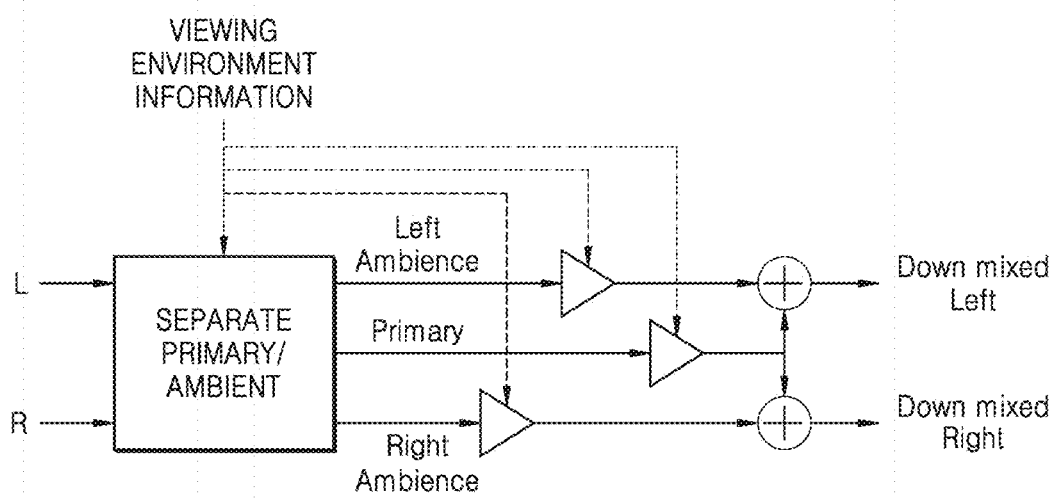
FIG. 9 is a diagram for explaining an example of processing an audio signal based on separation of a channel including a primary signal and a channel including an ambient signal from an input audio signal according to an embodiment.
Figure 10:
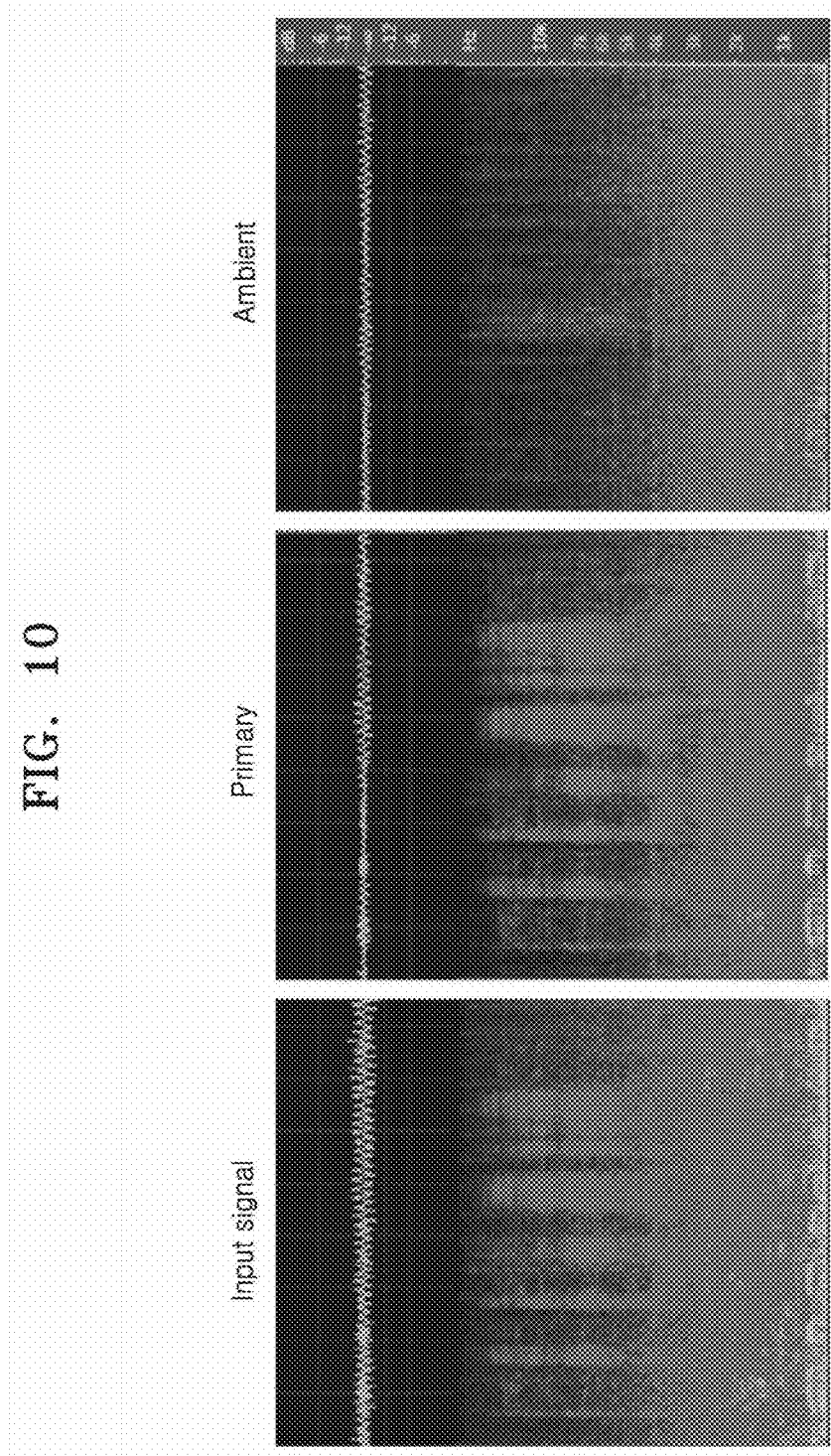
FIG. 10 is a diagram for explaining an example of processing an audio signal based on separation of a channel including a primary signal and a channel including an ambient signal from an input audio signal according to an embodiment.
Figure 12:
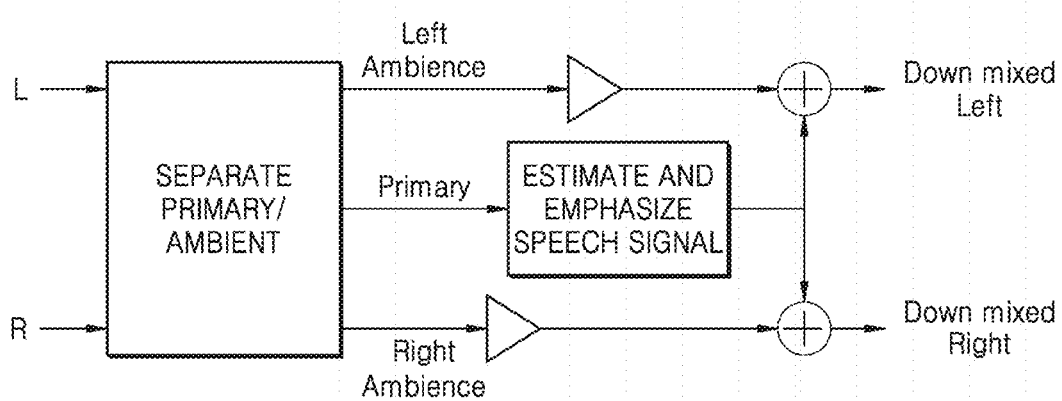
FIG. 12 is a diagram for explaining an example of processing an audio signal based on separation of a channel including a primary signal and a channel including an ambient signal from an input audio signal according to an embodiment.

FIG. 8 is a diagram for explaining an example of processing an audio signal based on extraction of a primary signal and an ambient signal from an input audio signal according to an embodiment. FIG. 9 is a diagram for explaining an example of processing an audio signal based on extraction of a primary signal and an ambient signal from an input audio signal according to an embodiment. FIG. 10 is a diagram for explaining an example of processing an audio signal based on extraction of a primary signal and an ambient signal from an input audio signal according to an embodiment. FIG. 11 is a diagram for explaining an example of processing an audio signal based on extraction of a primary signal and an ambient signal from an input audio signal according to an embodiment. FIG. 12 is a diagram for explaining an example of processing an audio signal based on extraction of a primary signal and an ambient signal from an input audio signal according to an embodiment.

FIG. 8 shows an example of separating a stereo input signal into a primary signal, a left ambience signal, and a right ambience signal.

FIG. 8 is a diagram for explaining a method of performing correlation calculation for each frequency domain, extracting a primary (center) component from left/right channels of the input audio signal, and separating the input audio signal into left/right ambience components using the extracted primary (center) component.

The electronic device 100 according to an embodiment may adjust a correlation between the left and right channels based on the viewing environment information. The electronic device 100 may extract a primary (center) signal based on the correlation between the left and right channels.

For example, when a degree of correlation is high, the electronic device 100 may extract a relatively large number of primary signals, and when the degree of correlation is low, the electronic device 100 may extract a relatively small number of primary signals. The electronic device 100 according to an embodiment may determine a weight as to a ratio at which the primary signal and the ambient signal are separated from the input stereo signal based on the viewing environment information.

Also, the electronic device 100 according to an embodiment may determine a ratio at which the primary signal and the ambient signal are mixed based on the viewing environment information.

For example, when a listener is in a loud environment, the electronic device 100 may extract the primary signal at a higher rate than the ambient signal from the input signal, and may provide a higher weight to the primary signal when mixing the extracted signal. Thus, intelligibility of a speech signal may be improved in the loud environment.

Also, when the listener is in a quiet environment, the electronic device 100 may increase an extraction ratio of the ambient signal from the input signal to extract the primary signal at a relatively small ratio.

Referring to FIG. 9, the electronic device 100 according to an embodiment may separate a channel including the primary signal and a channel including the ambient signal based on the viewing environment information, apply a gain to each of the separated channels in accordance with a calculated ratio, downmix and output the audio signal.

The electronic device 100 according to an embodiment may variably apply a gain value to the channel including the primary signal and the channel including the ambient signal according to the viewing environment information.

For example, in a loud environment, the electronic device 100 may apply a high primary gain to emphasize the primary signal that is relatively important to intelligibility of a signal, and may apply a small ambient gain to the ambient signal that is relatively less important.

FIG. 10 shows an example of frequency characteristics of a primary signal and an ambient signal Left separated from an input signal.

For example, when an ambient viewing environment is a noisy environment, the electronic device 100 may extract a relatively large number of channels including the primary signal by reducing an ambient weight.

FIG. 11 shows an example of extracting the primary signal according to a weight of the ambient signal.

Referring to FIG. 11, it may be seen that the primary signal is extracted in a larger manner when a low ambient weight is applied (weight low) 1102 than when a high ambient weight is applied (weight high) 1101.

Referring to FIG. 12, the electronic device 100 according to an embodiment may estimate a speech signal region that is relatively more important to sound intelligibility from the channel including the extracted primary signal, and emphasize a speech signal.

For example, even when it is assumed that most of the extracted primary signal is a speech part, a non-speech part might also be included. Thus, the electronic device 100 may estimate the speech part and the non-speech part from the extracted primary signal.

According to an embodiment, the electronic device 100 may estimate speech and non-speech regions using spectral flux and spectral flatness as a method of estimating the speech signal region.

According to an embodiment, the electronic device 100 may extract the speech signal from the input audio signal, and amplify the extracted speech signal to emphasize the speech signal. Accordingly, the electronic device 100 may enhance the intelligibility of the input audio signal by emphasizing the speech signal region that is relatively more important to the sound intelligibility.

Also, according to an embodiment, the electronic device 100 may improve the sound intelligibility by analyzing the input audio signal without utilizing viewing environment information.

According to an embodiment, the electronic device 100 may perform correlation calculation for each frequency band of the input audio signal to extract the primary component. The electronic device 100 may extract the speech signal region from the extracted primary signal.

According to an embodiment, the electronic device 100 may amplify the speech signal extracted from the input audio signal to emphasize the speech signal region, thereby improving the sound intelligibility.

Figure 13:
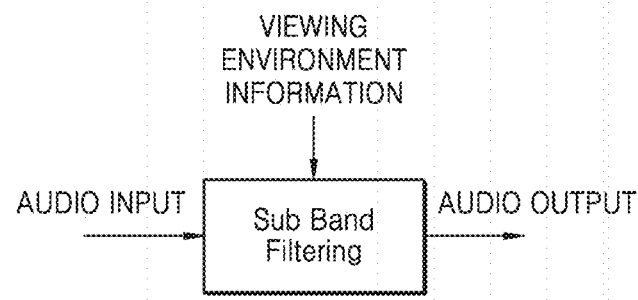
FIG. 13 is a diagram for explaining an example of processing an audio signal based on a frequency band according to an embodiment.

FIG. 13 is a diagram for explaining an example of processing an audio signal based on a frequency band according to an embodiment.

Referring to FIG. 13, the electronic device 100 may process the audio signal based on the frequency band and based on viewing environment information. According to an embodiment, the electronic device 100 may apply filtering to the audio signal based on the frequency band.

For example, when an ambient viewing environment is noisy, the electronic device 100 may reduce energy of a relatively unimportant frequency band in the audio signal that is not audible due to an ambient noise, and may focus energy corresponding to the reduced energy to the frequency band, thereby improving intelligibility of the audio signal.

The frequency band may be divided into a low range frequency band (several hundred Hz or less), a mid-range frequency band (several hundred to several thousand Hz), a high range frequency band (several thousand to several tens of thousands Hz) and an ultra-high range frequency band (several tens of thousands Hz or more). Of these, a band of 1 kHz to 5 kHz affects the clarity of sound and may be the most sensitive band in terms of human hearing characteristics.

According to an embodiment, the electronic device 100 may reduce energy of a frequency band with a low contribution rate of the clarity, and increase energy of a frequency band with a high contribution rate of the clarity, thereby improving sound intelligibility in a state where the overall energy is not greatly affected.

For example, the electronic device 100 may emphasize a mid-range frequency band that is relatively more important to intelligibility of a speech signal, while reducing energy of low and high range frequency bands of a relatively low speech signal.

Also, the electronic device 100 may reduce energy of a part where noise masking is more severe in the mid-range frequency band, and emphasize a part where noise masking is less severe, thereby enhancing the sound intelligibility.

Thus, in a state where the overall energy of the signal does not increase, the sound intelligibility may be improved.

Also, according to an embodiment, the electronic device 100 may identify a frequency region that may be masked, and apply filtering to the audio signal using the identified frequency region.

A masking effect is a phenomenon in which other notes are not audible when a particular note is present. For example, when an ambient viewing environment is an environment with a lot of noise, it may happen that sound transmitted from a TV may not be heard due to the noise.

Noise characteristics may be different for different devices (e.g., a cleaner, a hair dryer, etc.) that cause noise around the electronic device 100. The electronic device 100 may analyze noise output from other devices, determine a frequency region to be masked, and apply filtering to the audio signal using the determined frequency region.

According to an embodiment, the electronic device 100 may determine a frequency region that may be masked and apply a filter variably, based on magnitude or characteristics of the noise.

For example, the electronic device 100 may determine a frequency region that may be masked, reduce energy of a masked speech band, and increase energy of a speech band where masking is relatively low.

Figure 14:
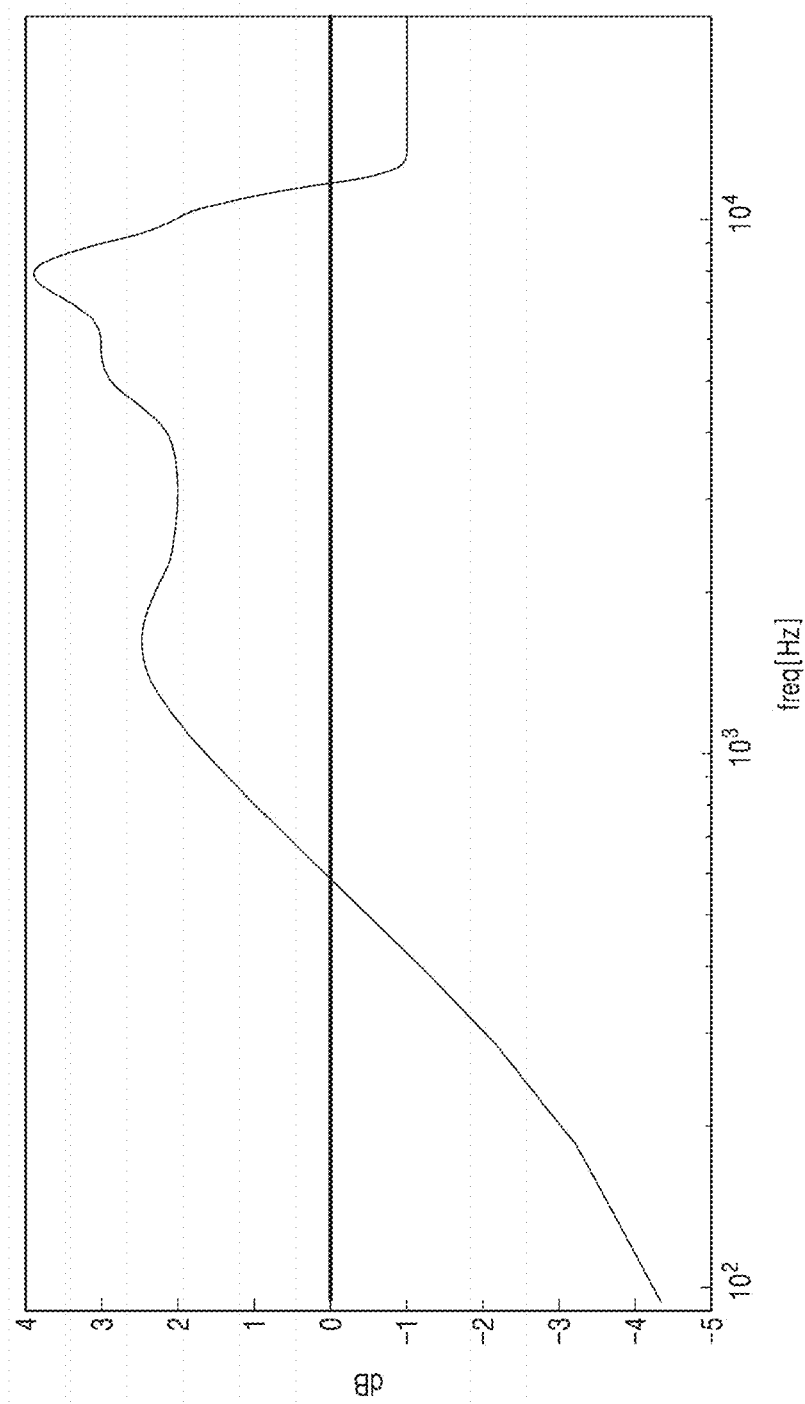
FIG. 14 is a diagram for explaining an example of processing an audio signal based on a frequency band according to an embodiment.

FIG. 14 is a diagram for explaining an example of processing an audio signal based on a frequency band according to an embodiment.

FIG. 14 shows an example of a filter applied to filtering of an audio signal.

According to an embodiment, the electronic device 100 may variably adjust a filter value based on viewing environment information.

For example, the filter of FIG. 14 emphasizes a frequency region of 1 kHz to 5 kHz that is important to the clarity and shows that low and high range frequency parts are reduced to similarly maintain energy of input/output signals.

Meanwhile, according to an embodiment, the electronic device 100 may apply filtering to downmixed left and right channels after separating primary/ambient signals.

Figure 15:
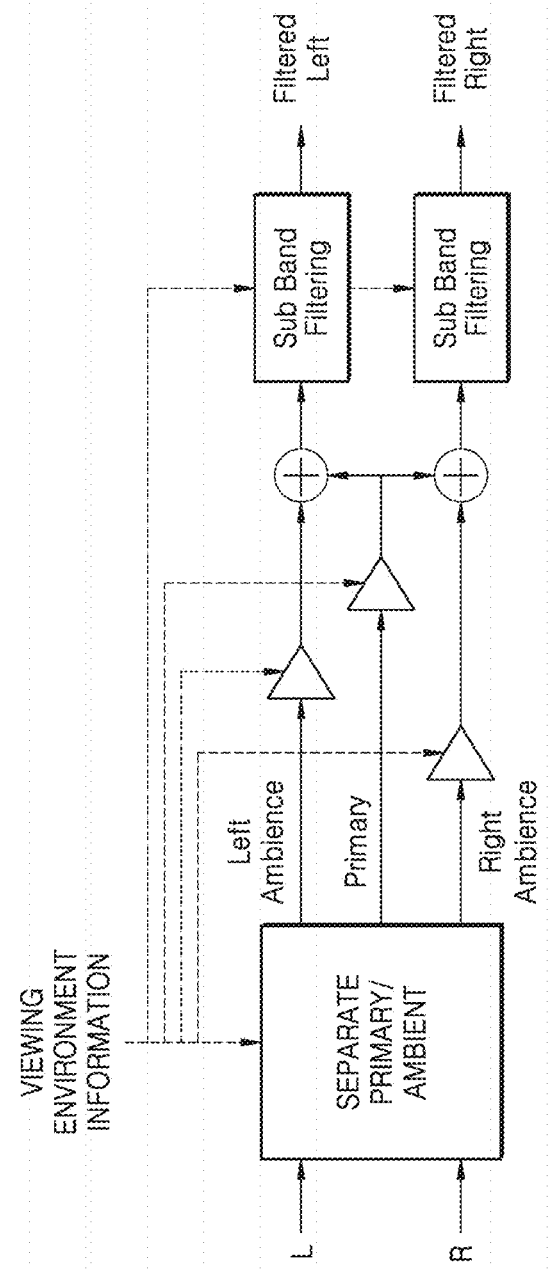
FIG. 15 is a diagram for explaining an example of processing an audio signal based on a frequency band according to an embodiment.

FIG. 15 is a diagram for explaining an example of processing an audio signal based on a frequency band according to an embodiment.

FIG. 15 shows a process of applying filtering to the downmixed left and right channels.

Also, according to an embodiment, the electronic device 100 may apply filtering to each of the primary signal and the ambient signal before downmixing. At this time, the electronic device 100 may apply the same filter or different filters to the primary signal and the ambient signal.

Figure 16:
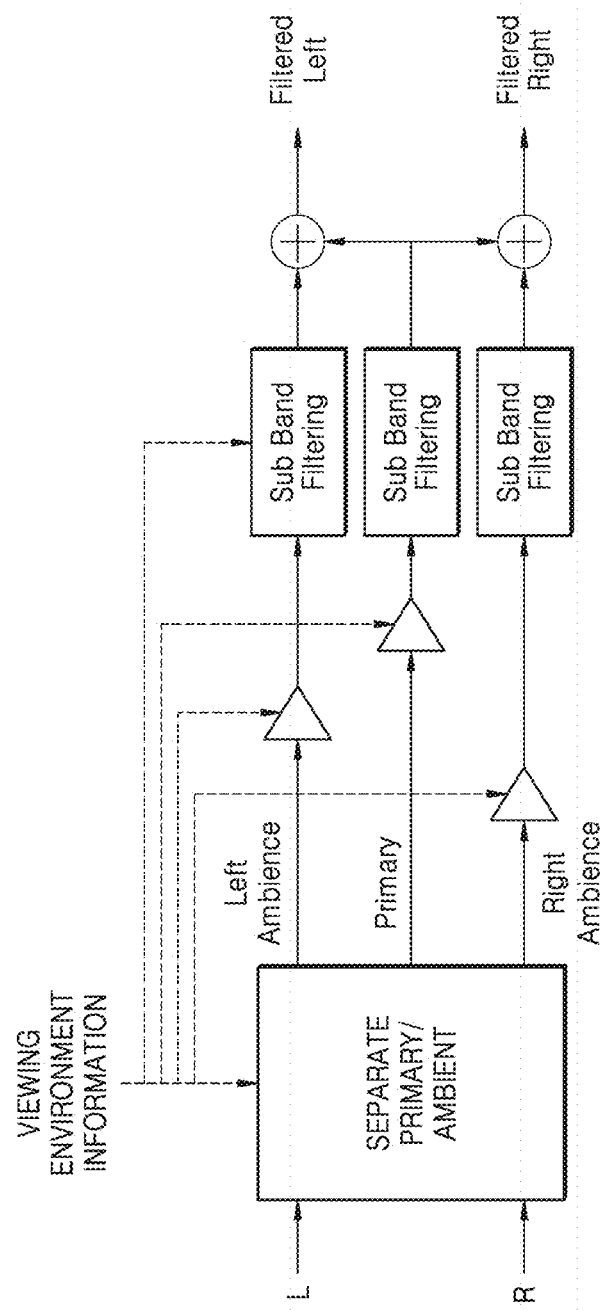
FIG. 16 is a diagram for explaining an example of processing an audio signal based on a frequency band according to an embodiment.

FIG. 16 is a diagram for explaining an example of processing an audio signal based on a frequency band according to an embodiment.

FIG. 16 shows a process of first applying filtering to a channel including the primary signal and a channel including the ambient signal before downmixing, and then downmixing and outputting the channels.

Figure 17:
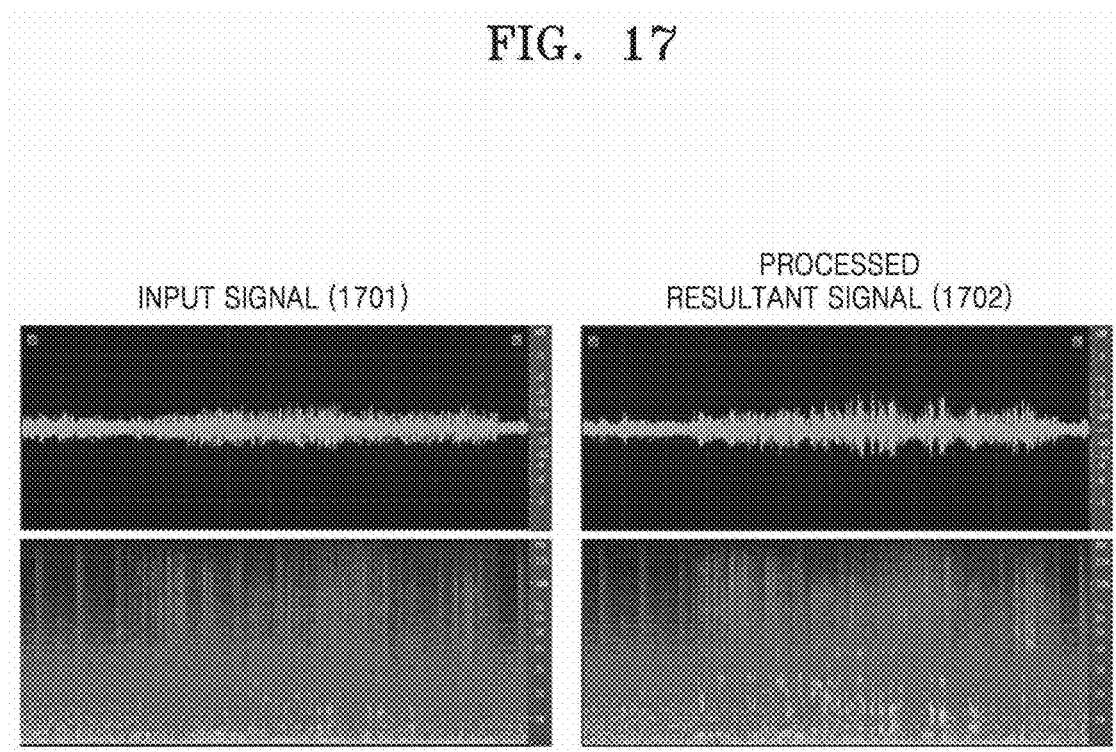
FIG. 17 is a diagram for explaining an example of energy compensation of a processed audio signal according to an embodiment.
Figure 18:
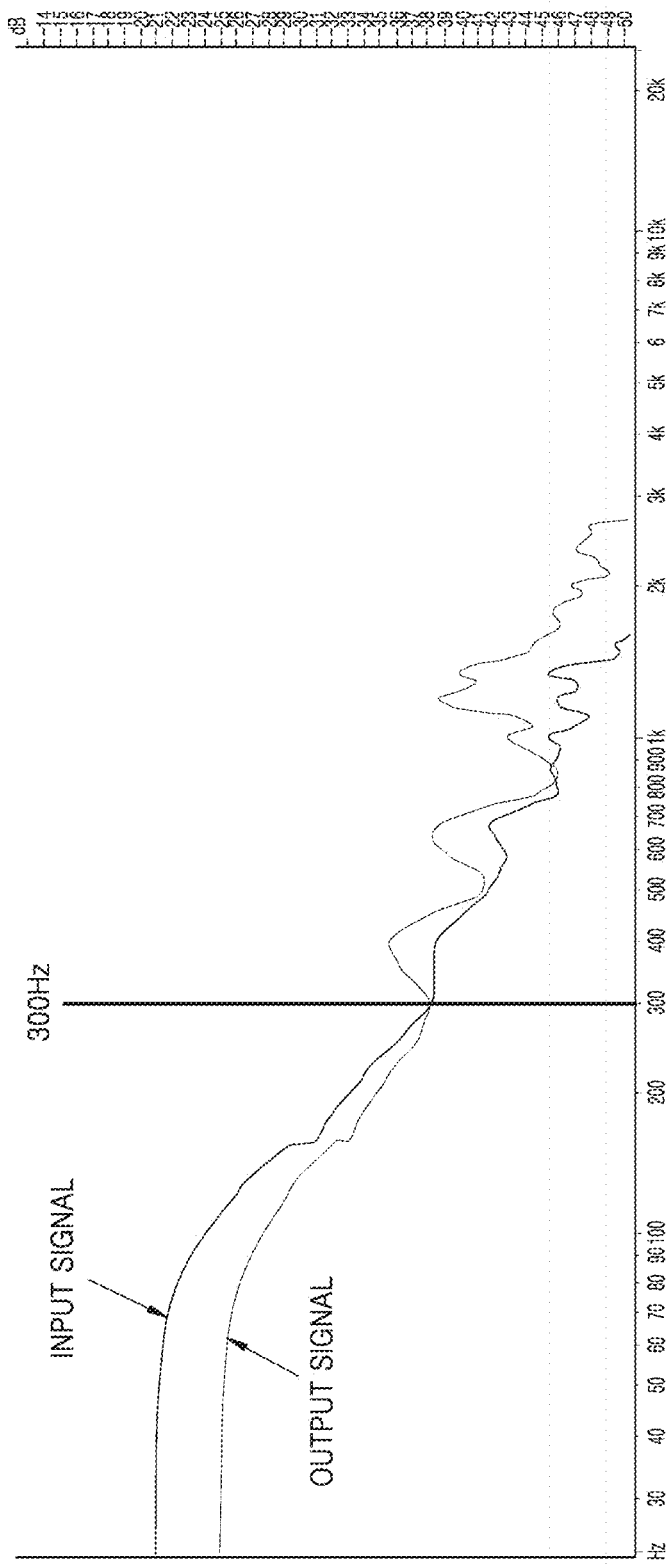
FIG. 18 is a diagram for explaining an example of energy compensation of a processed audio signal according to an embodiment.

FIG. 17 is a diagram for explaining an example of energy compensation of a processed audio signal according to an embodiment. FIG. 18 is a diagram for explaining an example of energy compensation of a processed audio signal according to an embodiment. FIG. 19 is a diagram for explaining an example of energy compensation of a processed audio signal according to an embodiment.

FIG. 17 shows waveforms of an input signal 1701 and a processed resultant signal 1702 with respect to one channel in an inputted stereo signal.

It may be seen from waveform variations of the input signal 1701 and the processed resultant signal 1702 shown in FIG. 17 that the waveform of the processed resultant signal 1702 (a result of applying adjustment and filtering of primary/ambient signals) is larger than the waveform of the input signal 1701 and that a mid-region in a frequency band is further emphasized.

However, according to an embodiment, the overall energy magnitude of an output signal output from the electronic device 100 may be similar to the input signal 1701. FIG. 18 shows that a low range of an output signal is lower than that of an input signal, and a mid-range thereof is relatively higher than the input signal.

FIG. 19 shows that when total root mean square (RMS) amplitude is identified, power values (RMS) of an input signal and an output signal are substantially the same.

When an input audio signal is processed by the primary/ambient signal processor 1002 (e.g., as shown in FIG. 1) and the frequency band signal processor 1003 (e.g., as shown in FIG. 1), an energy difference between the input audio signal and the output signal may occur as a processing result. For example, when the ambient signal is lower than the primary signal, the low and high ranges are attenuated, and a mid-range part of the input signal is compensated, the output signal may become much smaller than the input signal. At this time, performance may be improved by compensating for energy of the output signal in order to reduce an energy difference and a volume difference between the input signal and the output signal.

According to an embodiment, the energy compensator 1004 (FIG. 1) may compensate for the energy difference between the input signal and the output signal.

For example, and referring to Equation 1 shown below, the energy compensator 1004 (e.g., as shown FIG. 1) may compensate for the energy difference between the input and output signals by calculating an average RMS value of the input signal, and an average RMS value of a filtered signal output from the frequency band signal processor 1003 (e.g., as shown in FIG. 1) and providing a gain to the output signal according to a ratio of RMS values of the input/output signals.

$$\text{Gain} = \frac{RMS_{input}}{RMS_{output}} \quad \text{(Equation 1)}$$

Further, according to an embodiment, the electronic device 100 may process the input audio signal in a frame unit. The electronic device 100 may calculate the RMS values of the input/output signals for each frame, calculate a gain for each frame, and apply the gain to the output signal.

At this time, when the gain suddenly changes, because the gain between frames greatly varies, discontinuity between frames may occur. Therefore, the discontinuity between frames may be prevented by using gain smoothing or the like.

$$\text{Final Gain} = (1-\text{alpha}) \times \text{Previous Gain value} + \text{alpha} \times \text{Current Gain value} \quad \text{(Equation 2):}$$

For example, gain smoothing may be applied using Equation 2. It may be determined whether a final gain is applied between a gain calculated in a present frame, and a gain calculated in a previous frame to some extent by adjusting an alpha value, and the discontinuity between frames may be prevented.

Figure 20:
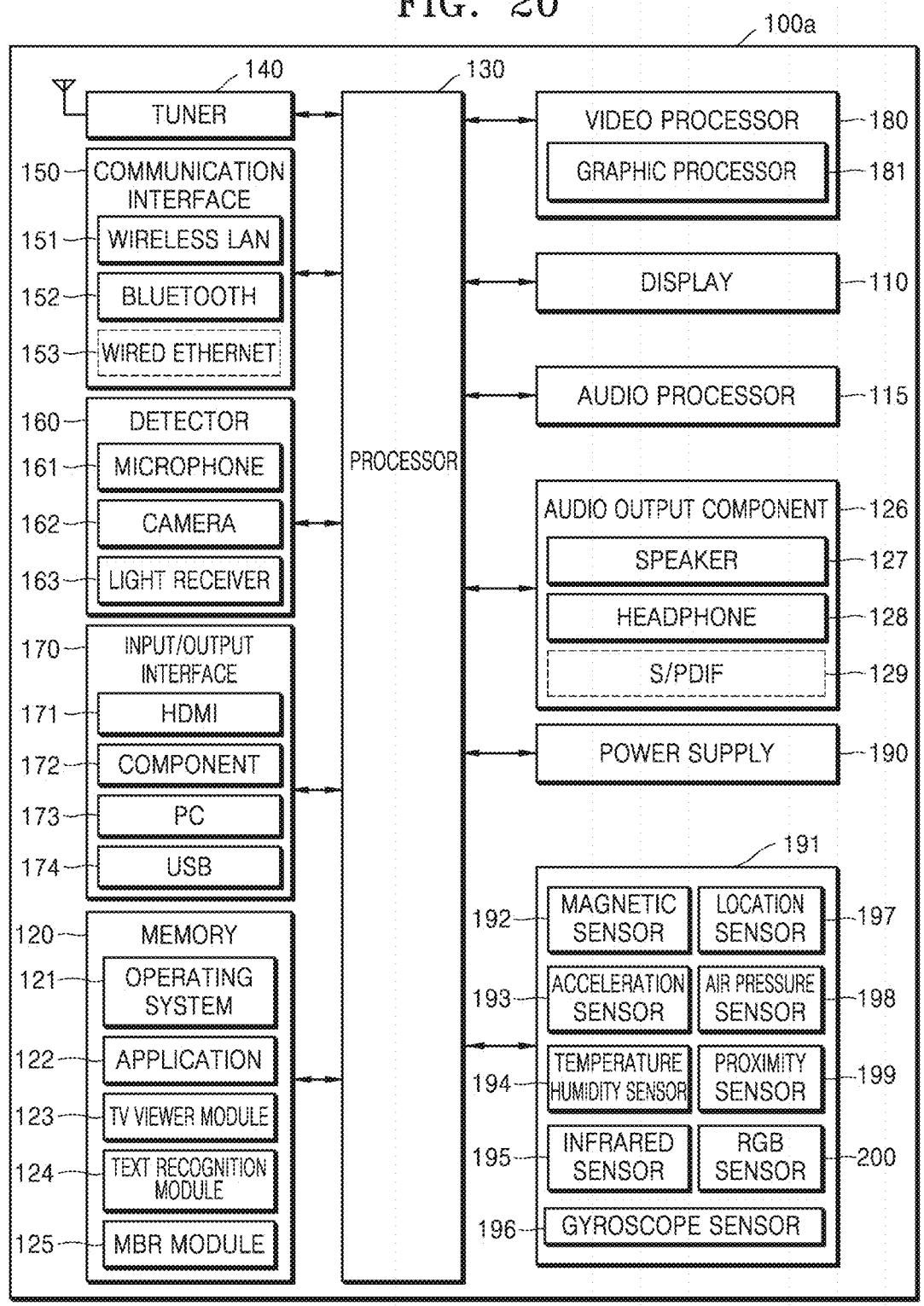
FIG. 20 is a block diagram of an electronic device according to an embodiment.

FIG. 20 is a block diagram of the electronic device 100a according to an embodiment.

The electronic device 100a of FIG. 2 may be an embodiment of the electronic device 100 of FIG. 1.

Operations of the sensor 1001 that is configured to obtain viewing environment information, the primary/ambient signal processor 1002, the frequency band signal processor 1003, and the energy compensator 1004 of FIG. 1 may be performed by an audio processor 115 of FIG. 20.

All illustrated components of FIG. 20 are not indispensable components. The electronic device 100 may be implemented by more components than the illustrated components, and the electronic device 100 may be implemented by less components than the illustrated components.

For example as shown in FIG. 20, the electronic device 100a according to an embodiment may further include a display 110, a memory 120, a processor 130, a tuner 140, a communication interface 150, a detector 160, an input/output interface 170, a video processor 180, the audio processor 115, an audio output component 126, a power supplier 190, and a sensor 191.

Hereinafter, the components will be described.

The processor 130 controls the overall operation of the electronic device 100 and the flow of a signal between internal components of the electronic device 100, and processes data. When a user input is received or a stored predetermined condition is satisfied, the processor 130 may execute an operating system (OS) and various applications stored in the memory 120.

The processor 130 may include a random access memory (RAM) that stores a signal or data input from the outside of the electronic device 1100 or is used as a storage region corresponding to various jobs performed by the electronic device 1100, a read-only memory (ROM) in which a control program for controlling the electronic device 1100 is stored, and a processor.

The processor 130 may include a graphic processing unit (GPU) (not shown) for graphic processing corresponding to a video. The processor 130 may be implemented as a SoC (System On Chip) incorporating a core (not shown) and a GPU (not shown). The processor 130 may include a single core, a dual core, a triple core, a quad core, and multiple cores thereof.

Also, the processor 130 may include a plurality of processors. For example, the processor 130 may be implemented as a main processor (not shown), and a sub processor (not shown) operating in a sleep mode.

According to an embodiment, the processor 130 may control the audio processor 115 to perform audio signal processing based on viewing environment information by executing one or more instructions stored in the memory 120.

The memory 120 may store various data, programs, or applications for driving and controlling the electronic device 100 under the control of the processor 130. The memory 120 may store input/output signal or data corresponding to the driving of the video processor 180, the display 110, the audio processor 115, the audio output component 126, the power supplier 190, a tuner 140, the communication interface 150, the detector 160, and the input/output interface 170.

The memory 120 may store an operating system 121 for control of the electronic device 100 and the processor 130, an application 122 that is originally provided by a manufacturer or is downloaded from an external source, a graphical user interface (GUI) related to the application 122, an object (e.g., an image text, an icon, a button, etc.) for providing the GUI, user information, documents, databases, or related data.

Also, the memory 120 may store a TV viewer module 123 including one or more instructions for receiving an input signal from a remote control device (not shown) and thereby performing channel control corresponding to the input signal or entering a channel scroll user interface mode when the input signal corresponds to a predefined input, a text recognition module 124 including one or more instructions for recognizing information from content received from an external device (not shown), and a multi-bitrate (MBR) module 125 including one or more instructions for channel control from the external device (not shown).

The memory 120 includes a ROM, a RAM, or a memory card (e.g., a micro SD card, a USB memory, not shown) mounted on the electronic device 100. The memory 120 may also include non-volatile memory, volatile memory, a hard disk drive (HDD), or a solid state drive (SSD).

According to an embodiment, the memory 120 may include at least one type storage medium of a flash memory type, a hard disk type, a multimedia card micro type, a card type memory (e.g., secure digital (SD) or extreme digital (XD) memory, etc.), RAM, static random access memory (SRAM), ROM, electrically erasable programmable read-only memory (EEPROM), programmable read-only memory (PROM), a magnetic memory, a magnetic disk, and an optical disk.

According to an embodiment, the memory 120 may store a look-up table including information about noise generated for each of various operation modes of the electronic device 100a.

The display 110 may display video included in a broadcast signal received through the tuner 140 (e.g., as shown in FIG. 3) under the control of the processor 130 on a screen. Also, the display 110 may display content (e.g., a moving image) input through the communication interface 150 or the input/output interface 170. The display 110 may output an image stored in the memory 120 under the control of the processor 130.

The display 110 may generate a driving signal by converting an image signal, a data signal, an on-screen display (OSD) signal, a control signal, or the like which are processed by the processor 130. The display 110 may be embodied as a plasma display panel (PDP), a liquid crystal display (LCD), an organic light-emitting display (OLED), a flexible display, or the like, and may also be embodied as a three-dimensional (3D) display. The display 110 may be configured as a touch screen to be used as both an output device and an input device.

According to an embodiment, the display 110 of the electronic device 100 may be implemented as a plasma display panel (PDP), a liquid crystal display (LCD), an organic light emitting diode (OLED), a cathode ray tube or the like.

The tuner 140 may tune and select a frequency of a channel that a user wants to receive via the electronic device 100, wherein the frequency is obtained by tuning, via amplification, mixing, and resonance, frequency components of a broadcasting signal that is received in a wired or wireless manner. The broadcasting signal includes an audio signal, a video signal, and additional information (e.g., an electronic program guide (EPG)).

The tuner 140 may receive a broadcast signal in a frequency domain corresponding to a channel number according to a user input (for example, a control signal received from a remote control device (not shown), e.g., a channel number input, a channel up-down input, and a channel input in an EPG screen).

The tuner 140 may receive broadcast signals from various sources such as terrestrial broadcast, cable broadcast, satellite broadcast, Internet broadcast, and the like. The tuner 140 may receive a broadcast signal from a source such as analog broadcast or digital broadcast. The broadcast signal received through the tuner 140 may be decoded (for example, audio decoding, video decoding, or additional information decoding) and separated into audio, video and/or additional information. The separated audio, video and/or additional information may be stored in the memory 120 under the control of the processor 130.

The tuner 140 of the electronic device 100 may be one or plural. The tuner 140 may be implemented as an all-in-one with the electronic device 100 or may be a separate device (e.g., a set-top box) having a tuner that is electrically connected to the electronic device 100, and a tuner (not shown) connected to the input/output interface 170.

The communication interface 150 may connect the electronic device 100 to an external device (e.g., an audio device, etc.) (not shown) under the control of the processor 130. The processor 130 may transmit/receive content to/from the external device (not shown) connected through the communication interface 150, download an application from the external device (not shown), or perform web browsing. The communication interface 150 may include one of a wireless local area network (LAN) 151, a Bluetooth 152, and a wired Ethernet (Ethernet) 153 according to a performance and a structure of the electronic device 100. The communication interface 150 may include a combination of the wireless LAN 151, the Bluetooth 152, and the wired Ethernet (Ethernet) 153.

Further, the communication interface 150 may receive the control signal of the remote control device (not shown) under the control of the processor 130. The control signal may be implemented as a Bluetooth type, a radio frequency (RF) signal type, or a wireless fidelity (Wi-Fi) type.

The communication interface 150 may further include a near field communication (for example, near field communication (NFC), not shown) interface and a Bluetooth low energy (BLE) (not shown) interface other than Bluetooth.

The detector 160 may detect a speech of the user, an image of the user, or an interaction of the user and include a microphone 161, a camera 162, and a light receiver 163.

The microphone 161 receives an utterance speech of the user. The microphone 161 may convert the received speech into an electric signal, and output the electric signal to the processor 130. The speech of the user may include, for example, a speech corresponding to a menu or a function of the electronic device 100.

According to an embodiment, the microphone 161 may receive sound around the electronic device 100a.

The camera 162 may obtain an image frame such as a still image or a moving image. An image captured through an image sensor may be processed through the processor 130 or a separate image processor (not shown).

The image frame processed by the camera 162 may be stored in the memory 1200 or transmitted to the outside through the communication interface 150. The camera 162 may include two or more cameras according to a structure of the electronic device 100.

The light receiver 163 receives an optical signal (including a control signal) received from an external remote control device (not shown). The light receiver 163 may receive the optical signal corresponding to a user input (e.g., touch, press, touch gesture, speech, or motion) from the remote control device (not shown). The control signal may be extracted from the received optical signal under the control of the processor 130. For example, the light receiver 163 may receive a control signal corresponding to a channel up/down button for channel switching from the remote controller (not shown).

The input/output interface 170 outputs video (e.g., a moving image and the like), audio (e.g., speech, music and the like) and additional information (e.g., EPG, etc.) from outside the display apparatus 100 under the control of the processor 130. The input/output interface 170 may include at least one of a high-definition multimedia interface (HDMI) port 171, a component jack 172, a PC port 173, or a USB port 174. The input/output interface 170 may include at least one combination of the HDMI port 171, the component jack 172, the PC port 173, or the USB port 174. An external image providing device (not shown) may be connected through the HDMI port 171.

The video processor 180 performs processing on video data received by the electronic device 1100. The video processor 180 may perform various kinds of image processing such as decoding, scaling, noise filtering, frame rate conversion, resolution conversion, and the like on the video data.

The graphic processor 181 generates a screen including various objects such as an icon, an image, a text, etc. using an operator (not shown) and a renderer (not shown). The operator (not shown) calculates attribute values such as a coordinate value, a shape, a size, and a color to be displayed by each of the objects according to a layout of the screen using the user input detected through the detector 160. The renderer (not shown) generates screens of various layouts including the objects based on the attribute values calculated by the operator (not shown). The screens generated by the renderer (not shown) are displayed within a display region of the display 110.

The audio processor 115 performs processing on audio data. The audio processor 115 may perform various kinds of processing such as decoding and amplification, noise filtering, and the like on the audio data. Meanwhile, the audio processor 115 may include a plurality of audio processing modules for processing audio corresponding to a plurality of contents.

According to an embodiment, the audio processor 115 may process the input audio signal based on the viewing environment information to generate an output signal.

Also, according to an embodiment, the audio processor 115 may process the audio signal based on the extraction of the primary signal and the ambient signal from the input audio signal, based on the viewing environment information.

Also, according to an embodiment, the audio processor 115 may determine the weight of the primary signal and the ambient signal based on the viewing environment information, and may separate the primary signal and the ambient signal according to the weight.

Also, according to an embodiment, the audio processor 115 may determine the gain values to be applied to the primary signal and the surrounding signal based on the viewing environment information and apply the determined gain value to the primary signal and the ambient signal.

Also, according to the embodiment, the audio processor 115 may process the audio signal based on the frequency band based on the viewing environment information.

Also, according to an embodiment, the audio processor 115 may determine a frequency band that is important to the sound intelligibility based on the viewing environment information, increase energy of the determined frequency band of the input audio signal, and reduce energy of a remaining frequency band.

Also, according to an embodiment, the audio processor 115 may determine the frequency band that is important to the sound intelligibility based on at least one of the human auditory characteristic or the masking due to noise.

Also, according to an embodiment, the audio processor 115 may adjust the energy value of the processed audio signal based on the energy difference between the input audio signal and the processed audio signal.

The audio output component 126 outputs audio included in the broadcast signal received through the tuner 140 under the control of the processor 130. The audio output component 126 may output audio (e.g., speech or sound) input through the communication interface 150 or the input/output interface 170. The audio output component 126 may also output audio stored in the memory 120 under the control of the processor 130. The audio output component 126 may include at least one of a speaker 127, a headphone output terminal 128, or a Sony/Philips Digital Interface (S/PDIF) output terminal 129. The audio output component 126 may include at least one combination of the speaker 127, the headphone output terminal 128, or the S/PDIF output terminal 129.

The power supply 190 supplies power to the internal components of the electronic device 100 from an external power source under the control of the processor 130. Also, the power supply 190 may supply power output from one or more batteries (not shown) located inside the electronic device 100 to the internal components under the control of the processor 130.

The sensor 191 may sense a state of the electronic device 100 or a state around the electronic device 100, and may transmit sensed information to the processor 130.

The sensor 191 includes a magnetic sensor 192, an acceleration sensor 193, a temperature humidity sensor 194, an infrared sensor 195, a gyroscope sensor 196, a location sensor (e.g. a GPS) 197, an air pressure sensor 198, a proximity sensor 199, and a red, green, blue (RGB) sensor (illuminance sensor) 200 but is not limited thereto. Functions of respective sensors may be intuitively inferred and thus, detailed descriptions thereof will be omitted.

Further, the electronic device 100 including the display 110 may be electrically connected to a separate external device (e.g., a set-top box, not shown) including the tuner 140.

Also, the electronic device 100 may be implemented as an analog TV, a digital TV, a 3D-TV, a smart TV, an LED TV, an OLED TV, a plasma TV, a monitor, etc. but is not limited thereto. It will be easily understood by one of ordinary skill in the art.

Meanwhile, the block diagrams of the illustrated electronic devices 100 and 100a are block diagrams for an embodiment. Each component of the block diagrams may be integrated, added, or omitted, according to the specifications of the actual implementation of the electronic device 100. That is, two or more components may be combined into one component, or one component may be subdivided into two or more components when necessary. Furthermore, a function performed in each block is for the purpose of explaining the embodiment, and a specific operation or device thereof does not limit the scope of the disclosure.

FIGS. 1 to 20 are for the purpose of explaining an embodiment and the disclosure is not limited thereto.

Meanwhile, the aforementioned embodiments of the disclosure may be written as programs that may be executed on computers, and may be implemented in general-use computers that execute the programs using a computer readable medium. In addition, a data structure used in the embodiments of the disclosure may be recorded on the computer readable medium via various devices. Also, the aforementioned embodiments of the disclosure may be embodied in the form of a recording medium including instructions executable by a computer, such as a program module that is executed by a computer. For example, methods implemented by software modules or algorithms may be stored in computer readable recording media as codes or program commands that may be read and executed by the computer.

The computer readable medium may be any recording medium that may be accessed by a computer and may include volatile and non-volatile media and removable and non-removable media. The computer readable medium may include magnetic storage media, such as ROM, floppy disks, and hard disks, and optical storage media, such as CD ROMs and DVDs, although not limited thereto. The computer readable medium may also include computer storage media and communication media. The computer readable medium may include a non-transitory computer readable medium.

Also, a plurality of computer readable recording media may be distributed over computer systems connected via a network, and data, such as program instructions and codes, stored in the distributed recording media may be executed by at least one computer.

The particular implementations shown and described in the disclosure are illustrative examples of the disclosure and are not intended to otherwise limit the scope of the disclosure in any way. For the sake of brevity, conventional electronics, control systems, software development and other functional aspects of the systems may not be described in detail.

Descriptions of the embodiments are exemplary, and it should be understood by one of ordinary skill in the art that various changes in form and details may be made therein without departing from the spirit and scope of the disclosure as defined by the appended claims. Thus, is the embodiments are merely exemplary in aspects and should not be construed as being limited to the embodiments set forth herein. For example, components that are described as an integrated piece may be separated, and components that are described as being separated may be integrated.

The use of any and all examples and exemplary language provided herein is intended merely to better illuminate the disclosure and does not pose a limitation on the scope of the disclosure unless otherwise claimed.

Moreover, no item or component is essential to the practice of the disclosure unless the element is specifically described as "essential" or "critical."

It will be understood by one of ordinary skilled in the art that various changes in form and details may be made therein without departing from the spirit and scope of the disclosure as defined by the appended claims.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure. The embodiments of the disclosure should be considered in descriptive sense only and not for purposes of limitation.

While the disclosure has been particularly shown and described with reference to embodiments thereof, it will be understood by those of ordinary skill in the art that various changes in form and details may be made therein without departing from the spirit and scope of the disclosure as defined by the following claims.

The terms, such as "unit," "module," etc., described herein should be understood as a unit that processes at least one function or operation and that may be embodied in hardware, software, and/or a combination of hardware and software.

The "unit" or the "module" may be stored in an addressable storage medium, or may be implemented by a program that may be executed by a processor.

For example, the "unit" or the "module" may be implemented by components such as software components, object-oriented software components, class components, and task components, processes, functions, properties, procedures, sub-routines, segments of program codes, drivers, firmware, micro codes, circuits, data, data base, data structures, tables, arrays, and parameters.

Throughout the specification, the description "A may include one of a1, a2, or a3" may mean, in a broad sense, that example elements that may be included in the element A are a1, a2, or a3.

Due to the above described description, the elements forming the element A are not limited to a1, a2, or a3. Therefore, the element that may be included in the A element should not be exclusively construed as being limited to a1, a2, and a3 excluding other elements that are not specified herein.

The description means that the element A may include a1, may include a2, or may include a3. The description does not mean that elements included in the element A should be selectively determined from a preset group. For example, the description should not be construed as being limited to that a1, a2, or a3 selected from a group necessarily including a1, a2, and a3 configures a component A.

In addition, throughout the disclosure, the expression "at least one of a1, a2, and a3" indicates only a1, only a2, only a3, both a1 and a2, both a1 and a3, both a2 and a3, all of a1, a2, and a3, or variations thereof. Therefore, unless otherwise clearly stated as "at least one of a1, at least one of a2, and at least one of a3", the expression "at least one of a1, a2, and a3" should not be construed as "at least one of a1", "at least one of a2", and "at least one of a3."

What is claimed is:

1. An operation method of an electronic device for processing an audio signal, the operation method comprising:
    obtaining viewing environment information related to sound intelligibility;
    processing an input audio signal by separating the input audio signal into a first channel including a primary signal and a second channel including an ambient signal based on the viewing environment information;
    processing the input audio signal based on a frequency band and the viewing environment information; and
    providing an output signal based on processing the input audio signal,
    wherein the providing of the output signal comprises adjusting an energy value of the input audio signal based on an energy difference between the input audio signal and the output audio signal.

2. The operation method of claim 1, wherein the viewing environment information includes at least one of information associated with ambient noise around the electronic device, information associated with a space where the electronic device is located, information associated with an ambient device around the electronic device, and information associated with an installation environment of the electronic device.

3. The operation method of claim 1, wherein the processing the input audio signal by separating the input audio signal into the first channel including the primary signal and the second channel including the ambient signal comprises:
    determining weights for the primary signal and the ambient signal based on the viewing environment information; and
    extracting the primary signal and the ambient signal based on the respective weights.

4. The operation method of claim 1, wherein the processing the input audio signal by separating the input audio signal into the first channel including the primary signal and the second channel including the ambient signal comprises:
    determining a first gain value to be applied to the primary signal and a second gain value to be applied to the ambient signal based on the viewing environment information; and
    applying the first gain value to the primary signal and the second gain value to the ambient signal.

5. The operation method of claim 1, wherein the processing of the input audio signal based on the frequency band comprises:
    determining the frequency band that is associated with the sound intelligibility based on the viewing environment information;
    increasing energy of the frequency band of the input audio signal; and
    reducing energy of a remaining frequency band.

6. The operation method of claim 5, wherein the determining of the frequency band comprises:
    determining the frequency band based on at least one of a human auditory characteristic or a noise masking characteristic.

7. An electronic device for processing an audio signal, the electronic device comprising:
    a sensor configured to obtain viewing environment information related to sound intelligibility; and
    one or more processors configured to:
        process an input audio signal by separating the input audio signal into a first channel including a primary signal and a second channel including an ambient signal based on the viewing environment information;
        process the input audio signal based on a frequency band and the viewing environment information; and
        provide an output signal based on processing the input audio signal,
        wherein the one or more processors are further configured to adjust an energy value of the input audio signal based on an energy difference between the input audio signal and the output audio signal.

8. The electronic device of claim 7, wherein the viewing environment information includes at least one of information associated with ambient noise around the electronic device, information associated with a space where the electronic device is located, information associated with an ambient device around the electronic device, and information associated with an installation environment of the electronic device.

9. The electronic device of claim 7, wherein the one or more processors are further configured to:

determine weights for the primary signal and the ambient signal based on the viewing environment information; and extract the primary signal and the ambient signal based on the respective weights.

10. The electronic device of claim 7, wherein the one or more processors are further configured to:

determine a first gain value to be applied to the primary signal and a second gain value to be applied to the ambient signal based on the viewing environment information; and apply the first gain value to the primary signal and the second gain value to the ambient signal.

11. The electronic device of claim 7, wherein the one or more processors are further configured to:

determine the frequency band that is associated with the sound intelligibility based on the viewing environment information;

increase energy of the frequency band of the input audio signal; and reduce energy of a remaining frequency band.

12. The electronic device of claim 11, wherein the one or more processors are further configured to:

determine the frequency band based on at least one of a human auditory characteristic or a noise masking characteristic.

13. A non-transitory computer-readable medium recording instructions for execution by a processor of an apparatus to cause the apparatus to perform operations comprising:

obtaining viewing environment information related to sound intelligibility;

processing an input audio signal by separating the input audio signal into a first channel including a primary signal and a second channel including an ambient signal based on the viewing environment information;

processing the input audio signal based on a frequency band and the viewing environment information; and providing an output signal based on processing the input audio signal, wherein the providing of the output signal comprises adjusting an energy value of the input audio signal based on an energy difference between the input audio signal and the output audio signal.

* * * * *